United States Patent

Kaneko et al.

Patent Number: 5,587,958
Date of Patent: Dec. 24, 1996

[54] SEMICONDUCTOR MEMORY DEVICE INCLUDING A BOOST POTENTIAL GENERATION CIRCUIT

[75] Inventors: Tetsuya Kaneko, Kawasaki; Takashi Ohsawa, Yokohama, both of Japan

[73] Assignee: Kabushiki Kaisha Toshiba, Kawasaki, Japan

[21] Appl. No.: 363,825

[22] Filed: Dec. 27, 1994

[30] Foreign Application Priority Data

Dec. 28, 1993 [JP] Japan ................... 5-349524

[51] Int. Cl.$^6$ ................................... G11C 8/00
[52] U.S. Cl. ................... 365/230.06; 365/222
[58] Field of Search ................... 365/189.09, 222, 365/230.06, 226

[56] References Cited

U.S. PATENT DOCUMENTS

| | | | |
|---|---|---|---|
| 4,862,420 | 8/1989 | Toda et al. | 365/191 |
| 4,933,907 | 6/1990 | Kumanoya et al. | 365/222 |
| 4,990,800 | 2/1991 | Lee | 307/465 |
| 5,023,843 | 6/1991 | Love | 365/222 |
| 5,109,360 | 4/1992 | Inazumi et al. | 365/230.02 |
| 5,276,646 | 1/1994 | Kim | 365/226 |
| 5,287,312 | 2/1994 | Okamura | 365/201 |
| 5,313,429 | 5/1994 | Chevallien | 365/226 |
| 5,363,333 | 11/1994 | Tsujimoto | 365/201 |

FOREIGN PATENT DOCUMENTS

| | | |
|---|---|---|
| 0476282 | 3/1992 | European Pat. Off. . |
| 0528352 | 2/1993 | European Pat. Off. . |
| 2-68791 | 3/1990 | Japan . |

OTHER PUBLICATIONS

Horiguchi et al., "A Tunable CMOS–DRAM Voltage Limiter with Stabilized Feedback Amplifier", IEEE Journal of Solid–State Circuits, Oct. 1990, No. 5, New York, pp. 1129–1134.
Publication, "A 1.5V Circuit Technology for 64Mb DRAMs", Y. Nakagome et al., *1990 Symposium on VLSI Circuits*, pp. 17–18.

*Primary Examiner*—A. Zarabian
*Attorney, Agent, or Firm*—Banner & Allegretti, Ltd.

[57] ABSTRACT

A semiconductor integrated circuit device includes a boost potential generation circuit, word line drive system circuit, refresh cycle select circuit, word line system boost potential generation circuit and boost potential generation system control circuit. The boost potential generation circuit steadily generates a higher boost potential than an externally applied voltage. The word line drive system circuit delivers the boost potential, as a power supply, from the boost potential generation circuit so as to drive the corresponding word line. The word line system boost potential control circuit sets at a substantially constant level a boost potential output from the boost potential generation circuit. The boost potential generation system control circuit receives a designation signal from the refresh cycle select circuit so as to designate a refresh cycle and supplies a control signal, which is generated based on the designation signal, to the boost potential generation circuit, whereby, when more word lines are driven at a time by the word line system drive circuit, a current supply capability of the boost potential generation circuit is increased and, when less word lines are driven at a time, the current supply capability of the boost potential generation circuit is decreased.

33 Claims, 13 Drawing Sheets

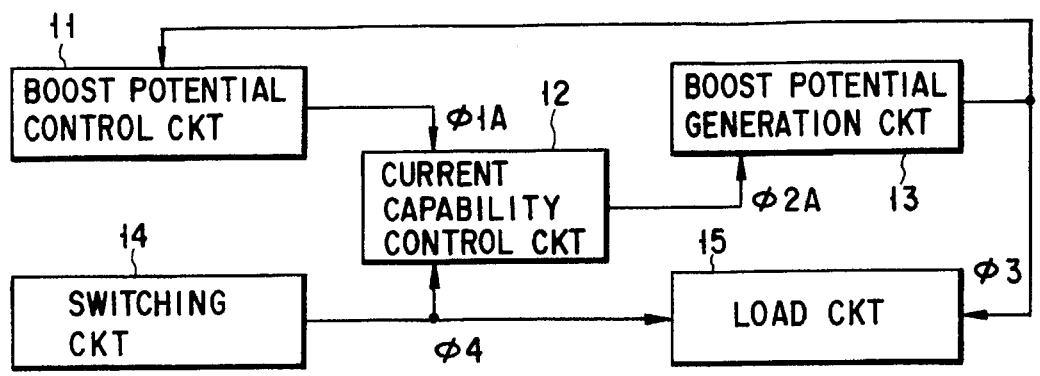
F I G. 1
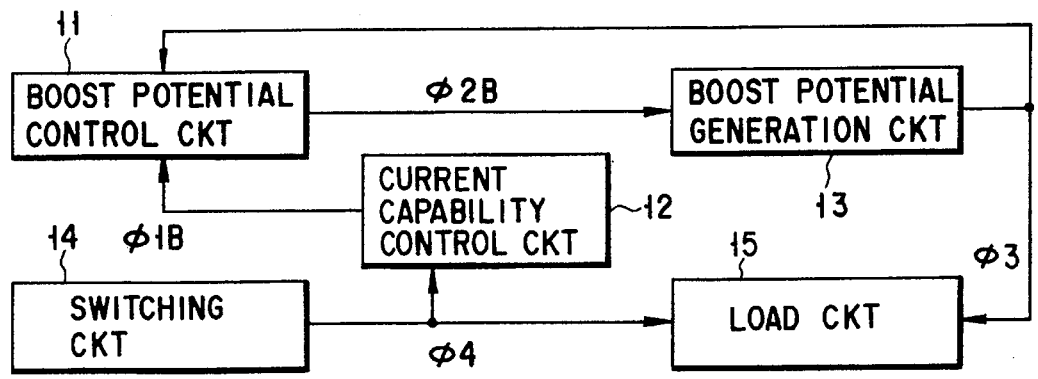
F I G. 2
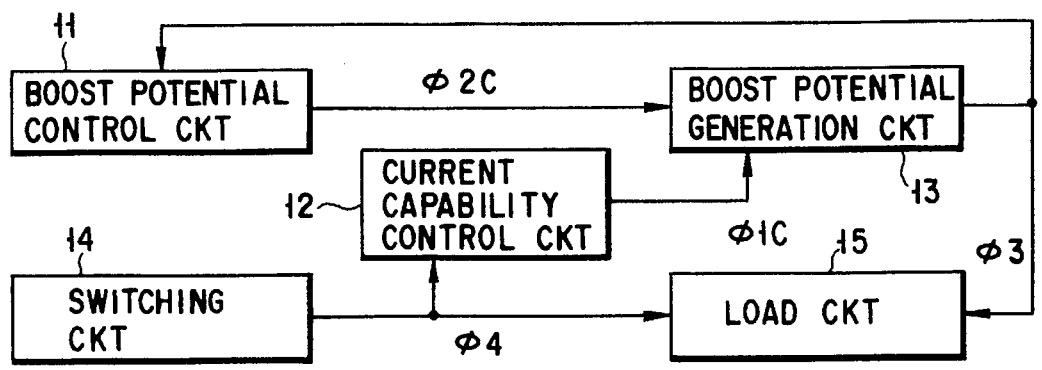
F I G. 3

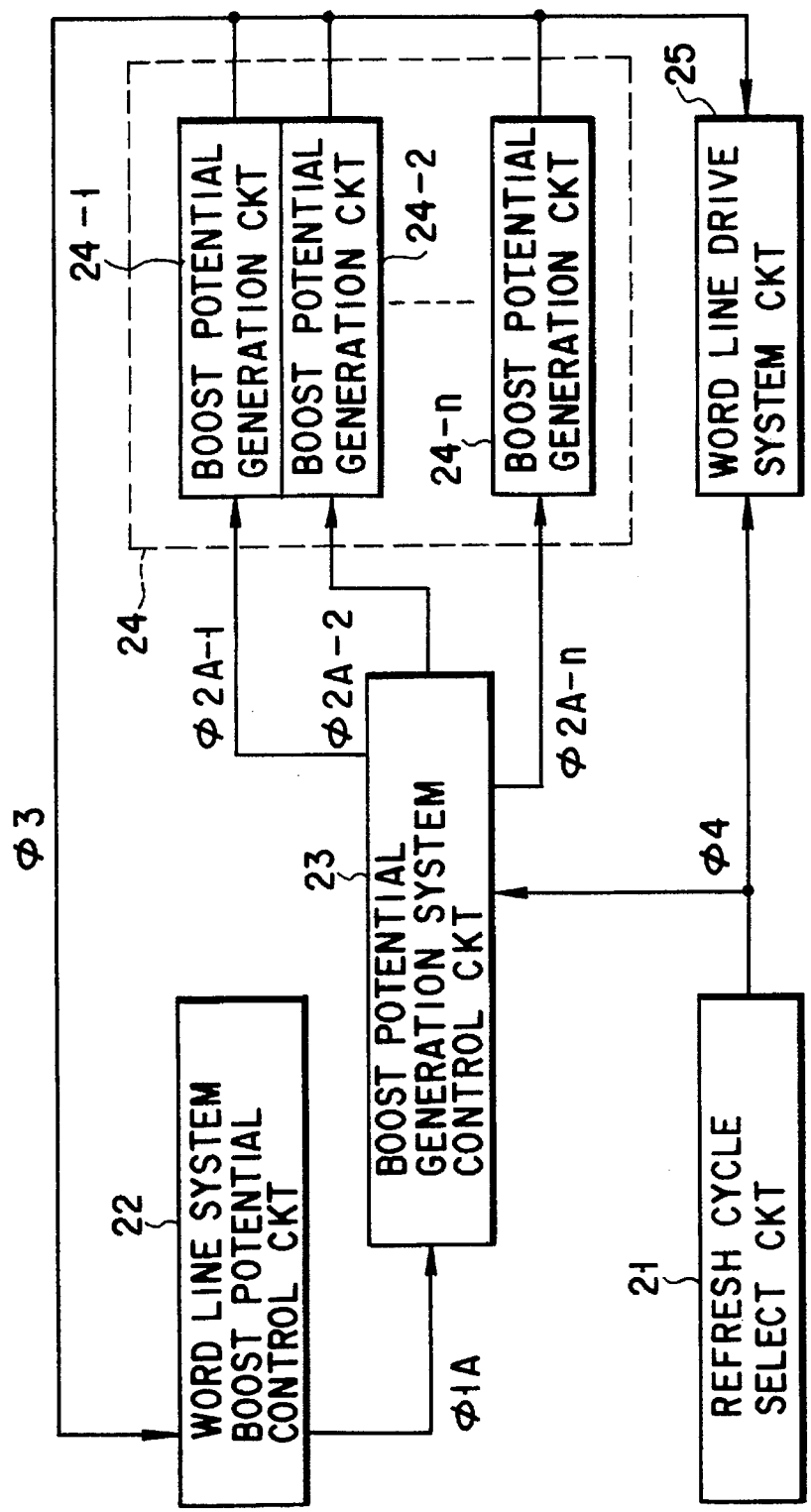
F I G. 5

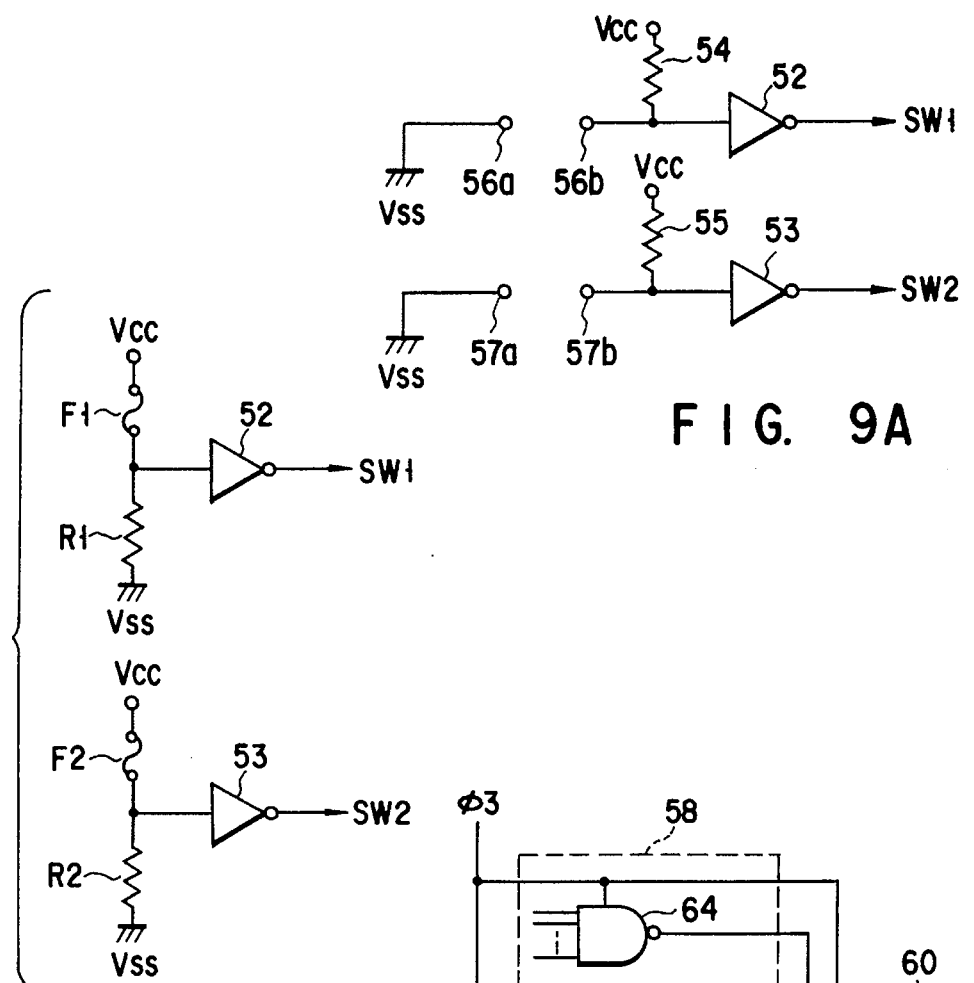
FIG. 9A
FIG. 9B
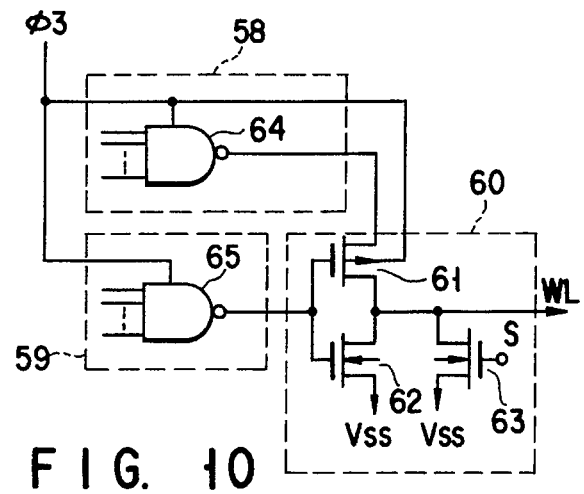
FIG. 10
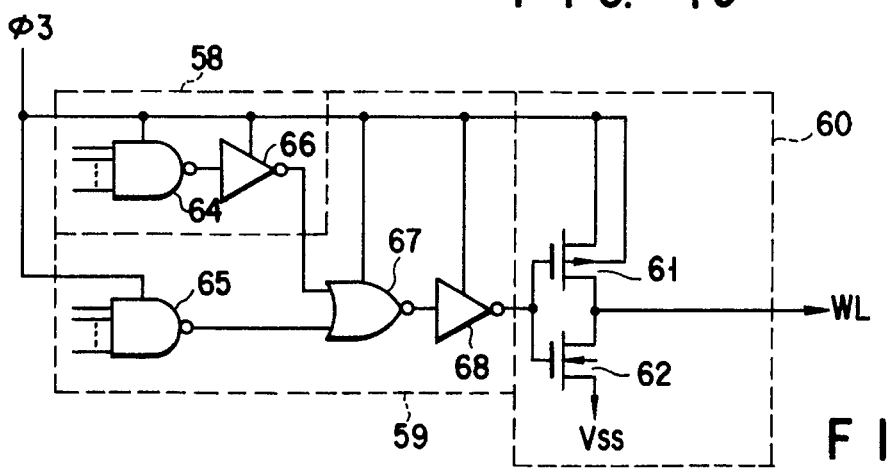
FIG. 11

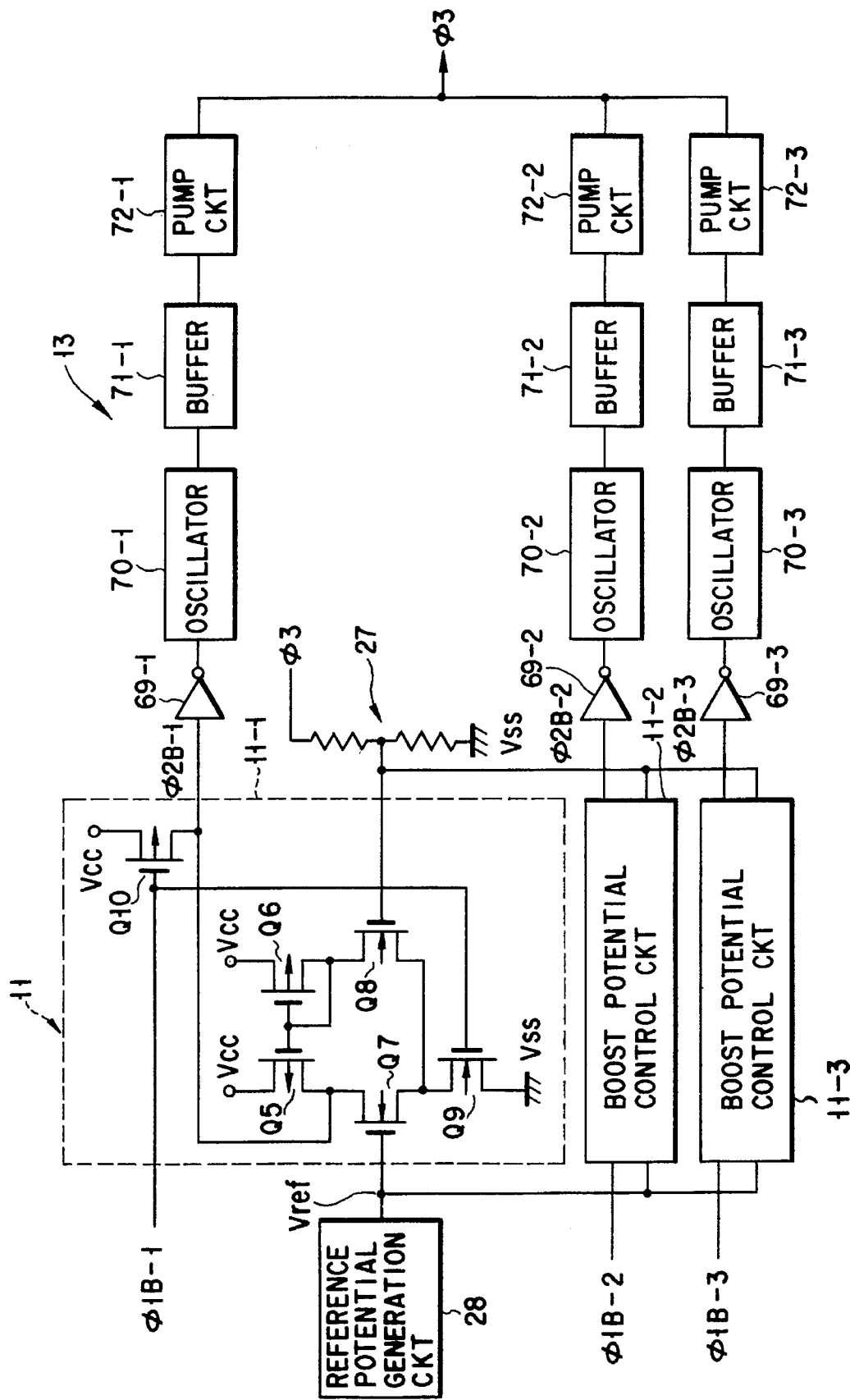
F I G. 12

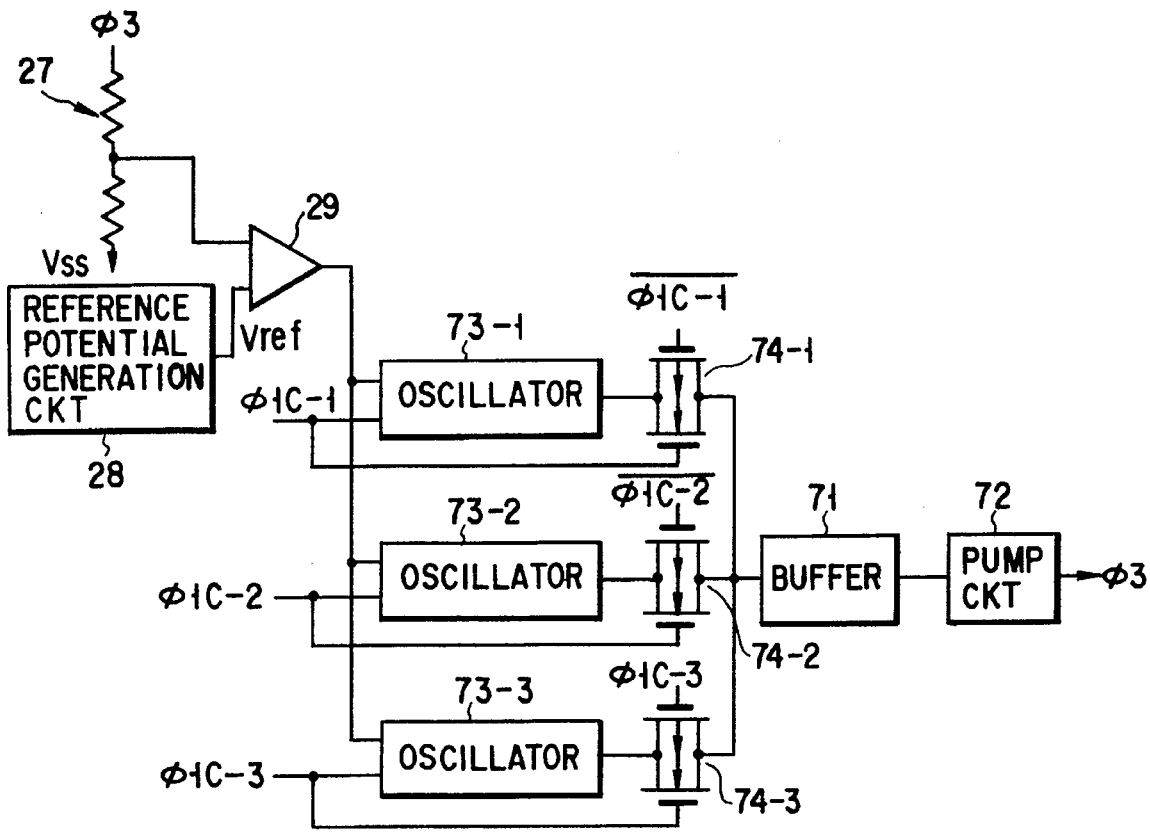
F I G. 13
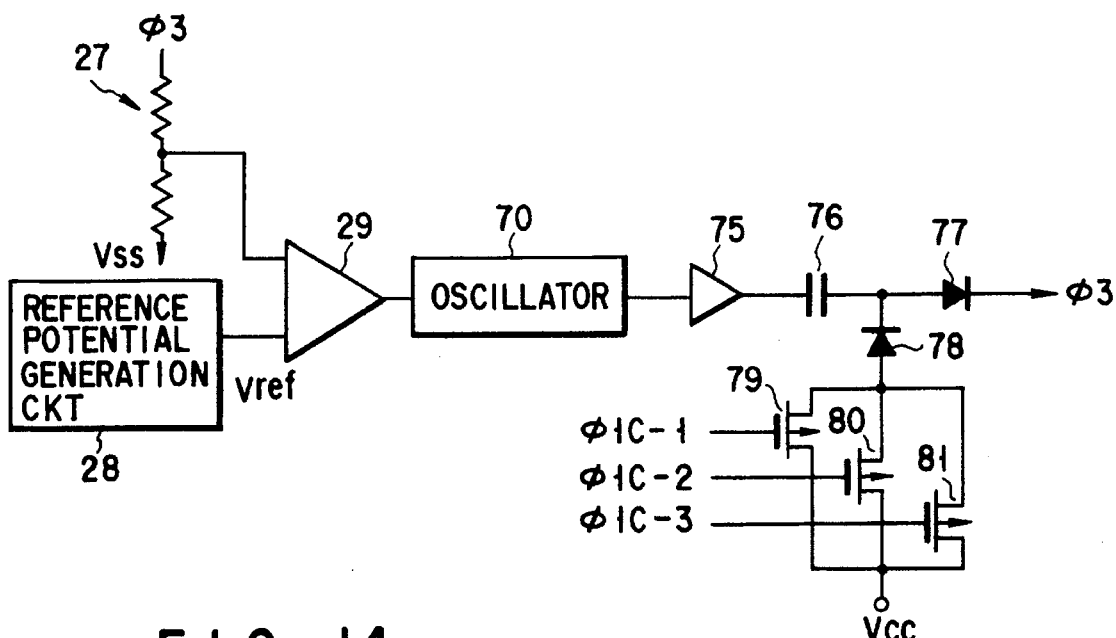
F I G. 14

SEMICONDUCTOR MEMORY DEVICE INCLUDING A BOOST POTENTIAL GENERATION CIRCUIT

BACKGROUND OF THE INVENTION

1. Field of the Invention

The present invention relates to a semiconductor integrated circuit device having a boost potential generation circuit and, in particular, a semiconductor memory device having a boost potential generation circuit for boosting a power supply voltage fed from an outside and applying it to a word line drive system circuit.

2. Description of the Related Art

For a dynamic random access memory (hereinafter referred to as a DRAM) it is necessary to refresh stored data in a memory cell in a predetermined time interval. The refresh cycle is determined by an external specification. The refresh cycle is of one kind for a 1M bit and a 4M bit DRAM and a plurality of kinds for over 16M bit DRAM according to the specification. In the 64M bit DRAM, for example, three kinds of refresh cycles are set on the specification: 2048, 4096, 8192 refresh cycles. When the number of refresh cycles varies, the number of word lines selected at a time at one refresh cycle varies correspondingly. In a 2048-refresh cycle product, four times the number of word lines are simultaneously selected on a 8192 refresh cycle product.

In a semiconductor memory device including a boost potential generation circuit for boosting a power supply voltage fed from an outside and supplying it to a word line drive system circuit and adapted to drive associated word lines with the use of the output of the boost potential generation circuit, a ratio between the number of simultaneously selected word lines and the current supply capability of the boost potential generation circuit for driving the word lines varies in accordance with the specification of the refresh cycle. In other words, for a refresh cycle product varying in potentials on the word lines in accordance with the refresh cycle specification and having more number of simultaneously selected word lines (or low refresh cycle), there is a risk that data access to and from the memory cell will become incomplete.

A semiconductor memory device for driving word lines with the use of an output of the above-mentioned boost potential generation circuit is disclosed, for example, in 1990 Symposium on VLSI Circuits pp. 17–18, "A 1.5 V Circuit Technology for 64 Mb DRAMs" Y. Nakagome et al. It may be considered that a plurality of kinds of chips be formed with the current supply capability of the boost potential generation circuit varied for each refresh cycle so as to correspond to the above-mentioned refresh cycle and current supply capability of the boost potential generation circuit for word line drive. However, the use of more kinds of chips lead to a greater drop in the development efficiency and in production efficiency.

For the semiconductor memory device, the change of refresh cycles is made, by the use of switching means such as wire bonding and fuses, so as to handle more kinds of chips. The technique for varying the number of refresh cycles and word line potential boosting capacity by the switching means is disclosed in Japanese Patent Application 4-221694 filed by the same applicant as that of the present application and corresponding to U.S. patent application Ser. No. 07/935,174. As a boost potential generation circuit for driving the word lines of a DRAM, use has been made of the usual method called "the bootstrap method". In this technique, potential boosting is achieved by supplying a drive signal to a precharged capacitor. In this case, a plurality of kinds of chips different in their refresh cycles are manufactured from one kind of chip by varying the capacitance (word line potential-boosted capacitance) of a bootstrap circuit in accordance with the refresh cycle.

A recent tendency has been made toward lowering a power supplying voltage in the semiconductor memory device. In the detail, shifting has been made from the conventional 5 V system to a 3.3 V or a 3 V system. With the lowering of the power supply voltage, there is a risk that a boost potential on the word line will not be able to be adequately increased in the conventional bootstrap system.

As one solution to this problem, proposals have been made to steadily generate a boost potential and use it as a power supply for a word line drive circuit. As a method for steadily generating the boost potential, use has principally made of one utilizing a charge pump circuit. In this case, however, there arises a variation in an internal potential, that is, in the output of the boost potential generation circuit. If the current supply capability of the charge pump circuit becomes greater, the lowering of the internal potential is prevented at the time of operating the internal circuit, but there arises a variation (ripple) in the boost potential resulting from the operation of the charge pump. If the current supply capability of the charge pump circuit is made small, the ripple becomes small but there occurs a greater drop at the time of operating the internal circuit acting as a load for the charge pump circuit. In this case, it is necessary that the current supply capability of the internal potential boosting circuit be made greater than, but not excessively, than the current required at a time of operating the internal circuit acting as a load.

In the case where, in the conventional semiconductor integrated circuit, particularly, a semiconductor memory device, there occurs a variation in current supply capability required of the boost potential generation circuit, the current supply capability of the boost potential generation circuit has been so set as to correspond to the case where current supply capability is the greatest at the low refresh cycle. With the current supply capability so set, the current supply capability of the boost voltage generating circuit becomes excessive at the high refresh cycle, thus presenting a problem with a greater ripple in the internal potential. In order to prevent any ripple, a greater load capacitance be connected to the boost potential output terminal. The use of a greater load capacitance leads to an increase in the size of the chip and an eventual fall in reliability.

SUMMARY OF THE INVENTION

One object of the present invention is to provide a semiconductor integrated circuit device equipped with a boost potential generation circuit capable of driving a load circuit with an optimal current drive capability even if there is a variation in a product specification.

Another object of the present invention is to provide a semiconductor memory device equipped with a boost potential generation circuit capable of driving a word line drive system circuit with a current drive capability corresponding to a refresh cycle.

Another object of the present invention is to provide a semiconductor integrated circuit device equipped with a boost potential generation circuit capable of suppressing a ripple without increasing size of a chip and lowering reliability.

According to one aspect of the present invention, there is provided a semiconductor memory device comprising:

boost potential generating means for steadily generating a higher boost potential than an externally applied voltage;

word line drive means for receiving an output potential of the boost potential generating means as a power supply and for driving word lines; and control means for receiving a designation signal for designating a product specification and for supplying, to the boost potential generating means, a control signal which is generated based on the designation signal, wherein, when more word lines are driven at a time by the word line drive means, a current supply capability of the boost potential generating means is increased and, when less word lines are driven at a time by the boost potential generating means, the current supply capability of the boost potential generating means is decreased.

According to another aspect of the present invention, a semiconductor integrated circuit device is provided including a boost potential generation circuit for generating a higher boost potential generation circuit than an externally applied voltage, the device comprising:

a first circuit for delivering a switching signal in accordance with a product specification;

a second circuit for receiving an output potential of the boost potential generation circuit as a power supply;

a third circuit for enabling a maximal current which is supplied from the boost potential generation circuit to the second circuit to vary based on a switching signal delivered from the first circuit; and a fourth circuit for receiving an output of the boost potential generation circuit to controllably set the boost potential constant.

The above-mentioned prior art problem has been encountered because there arises a variation in a load of the boost potential generation circuit in spite of the current supply capability of the boost potential generation circuit being constant. According to the present invention, therefore, the current supply capability of the boost potential generation circuit is so constructed as to meet a variation in a load involved. In the case where a greater load current state, such as a low refresh cycle, is selected, the current supply capability of the boost potential generation circuit is increased and, in the case where a smaller load current state, such as a high refresh cycle, is selected, the current supply capability is decreased.

It is, therefore, possible to drive the load circuit with an optimal current drive capability even if the product specification is varied. Further it is also possible to drive a word line drive system circuit with a current drive capability corresponding to a refresh cycle. A ripple can be suppressed because driving can be achieved with a current supply capability corresponding to the load. At this time, the size of a chip need not be increased because there is no need to provide an added capacitance. It is possible to prevent any lowered stability.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a block diagram for explaining a semiconductor memory device according to a first embodiment of the present invention, a view showing an internal voltage control circuit extracted;

FIG. 2 is a block diagram for explaining a semiconductor memory device according to a second embodiment of the present invention, a view showing another practical form of an internal voltage control circuit;

FIG. 3 is a block diagram for explaining a semiconductor memory device according to a third embodiment of the present invention, a view showing another practical form of an internal voltage control circuit;

FIG. 5 is a block diagram showing a detail of a refresh cycle select circuit, word line drive potential generation circuit and row decoder circuit in the circuit arrangement shown in FIG. 4;

FIG. 9A is a circuit diagram showing a detailed practical form of a refresh cycle select circuit in the circuit arrangement shown in FIG. 5;

FIG. 9B is a circuit diagram showing a detailed practical form of a refresh cycle select circuit in the circuit arrangement shown in FIG. 5;

FIG. 10 is a circuit diagram showing a practical word line drive system circuit in the circuit arrangement shown in FIG. 5;

FIG. 11 is a circuit diagram showing another practical form of the word line drive system circuit shown in FIG. 5;

FIG. 12 is a circuit diagram showing a detailed practical form of the boost potential control circuit and of the boost potential generation circuit shown in FIG. 2;

FIG. 13 is a circuit diagram showing a detailed practical form of the boost potential control circuit and of the boost potential generation circuit as shown in FIG. 3, a view showing a plurality of oscillators whose oscillation frequencies are varied selectively;

FIG. 14 is a circuit diagram showing a detailed practical form of the boost potential control circuit and of the boost potential generation circuit shown in FIG. 3, a view showing an oscillator whose oscillation frequency is varied by varying a current through a charge pump circuit;

DETAILED DESCRIPTION OF THE PREFERRED EMBODIMENTS

Figure 4:
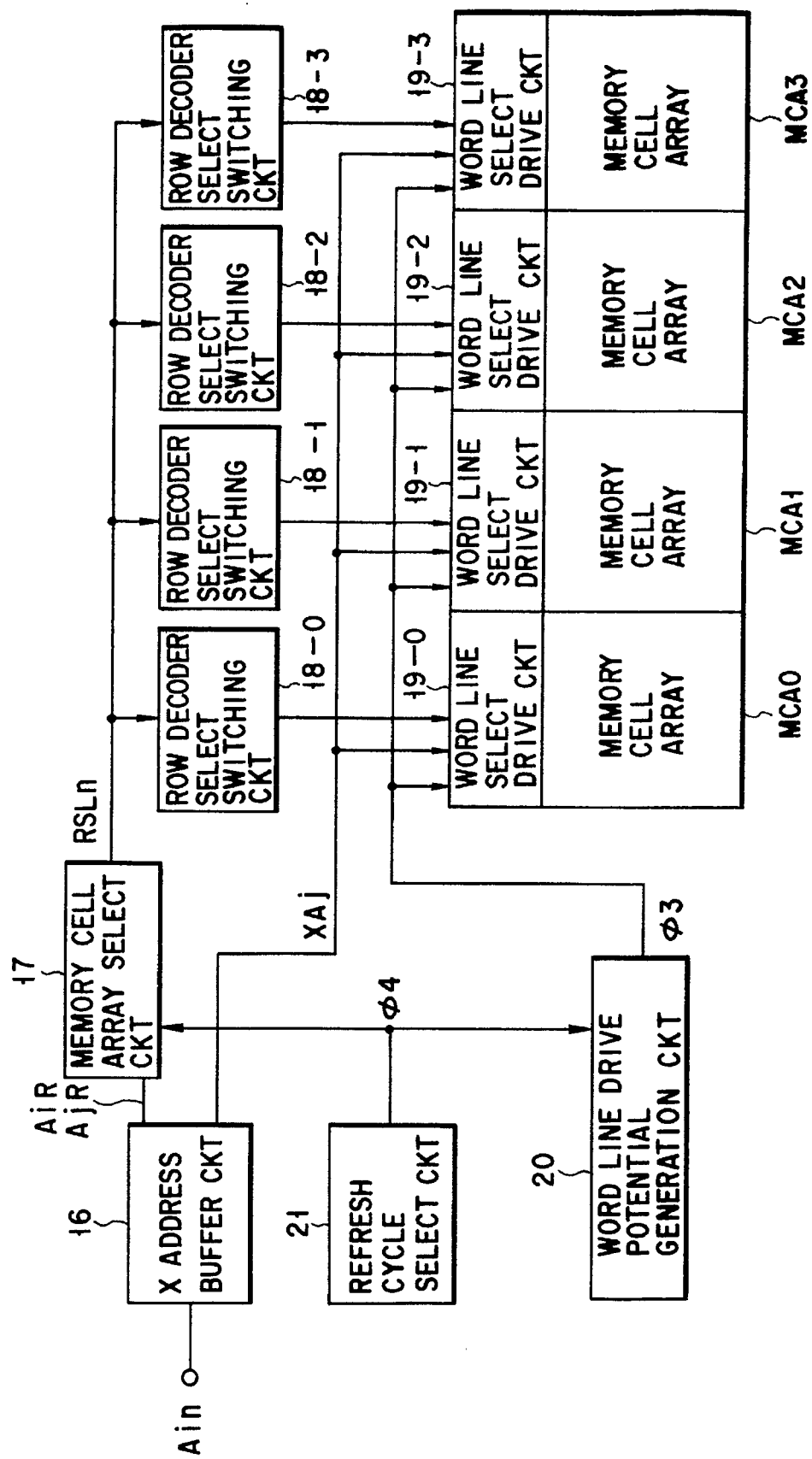
FIG. 4 is a block diagram showing a practical form with the internal voltage generation circuit in FIG. 1 applied to a DRAM.

FIG. 1 is a block diagram showing the operation of an internal voltage control circuit in a semiconductor integrated circuit device according to a first embodiment of the present invention.

The internal voltage control circuit comprises a boost potential control circuit 11, current capability control circuit 12, boost potential generation circuit 13, switching circuit 14 and load circuit 15. The boost potential control circuit 11 is adapted to set the output (boost potential) $\phi 3$ of the boost potential generation circuit 13 substantially constant. The control circuit 11 supplies its output to the boost potential generation circuit 13 via the current capability control circuit 12 to control the level of the boost potential $\phi 3$. The current capability control circuit 12 receives both an output signal $\phi 4$ of the switching circuit 14 for varying a state (load) of the load circuit 15 and the output signal $\phi 1A$ of the boost potential control circuit 11 to control the maximal current supply capability of the boost potential generation circuit 13 and delivers a control signal $\phi 2A$ reflecting the output $\phi 1A$ of the boost potential control circuit 11 so as to set the boost potential $\phi 3$ at a substantially constant level. The boost potential generation circuit 13 boosts a power supply voltage coming from an outside and generates it as a boost potential $\phi 3$ of a substantially constant level. The load circuit 15 operates with the boost potential $\phi 3$ as a power supply, has its load varied upon receipt of the output signal $\phi 4$ from the switching circuit 14 and allows a current which flows from the boost potential generation circuit 13 to vary by the output signal $\phi 4$. The switching circuit 14 delivers the signal $\phi 4$ for varying the operation of the load circuit 15. The output signal $\phi 4$ is supplied to the current capability control circuit 12.

In the circuit arrangement shown in FIG. 1, the output signal $\phi 1A$ of the boost potential control circuit 11 is supplied to the current capability control circuit 12 and the output signal $\phi 2A$ of the current capability control circuit 12 is supplied to the boost potential generation circuit 13. If this arrangement is applied to, for example, one equipped with a boost potential control circuit 11 in one system and a boost potential generation circuit 13 in a plurality systems, the current capability control circuit 12 enables a signal which reflects the signal $\phi 1A$ to be delivered to the boost potential generation circuit 13 in at least one of the systems in accordance with the output signal $\phi 4$ of the switching circuit 14 and a signal which is not dependent upon the signal $\phi 1A$ to be delivered to the potential generation circuit in the remaining systems. In this case, depending upon the date of the signal $\phi$, the number of systems of the boost potential generation circuit 13 in a resultant active state varies, that is, the current supply capability of the boost voltage generation circuit 13 varies in accordance with the signal $\phi 4$.

FIGS. 2 and 3, each, show another form of an internal voltage control circuit shown in FIG. 1. The embodiments shown in FIGS. 1, 2 and 3 are different from each other with respect to their connection relation of the boost potential control circuit 11, current capability control circuit 12 and boost potential generation circuit 13.

In the circuit arrangement shown in FIG. 2, an output signal $\phi 1B$ of the current capability control circuit 12 is supplied to a boost potential control circuit 11 and an output signal $\phi 2B$ of the boost potential control circuit 11 is supplied to a boost potential generation circuit 13. The arrangement above is suitable to, for example, that having a boost potential control circuit in a plurality of systems and boost potential generation circuit in a plurality of systems 13 and the current capability control circuit 12 makes the boost potential control circuit 11 in at least one system at an active state depending upon the state of a signal $\phi 4$. The boost potential control circuit at the active state delivers, as an output signal $\phi 2B$, a signal reflecting the level of a boost voltage $\phi 3$ and, instead of the boost voltage $\phi 3$, the signal $\phi 2B$ for stopping the boost potential generation circuit is supplied to the boost potential control circuit in the remaining systems. This enables the current supply capability of the boost potential generation circuit to vary in accordance with the signal $\phi 4$ as in the circuit arrangement shown in FIG. 1.

In the circuit arrangement shown in FIG. 3, both an output signal $\phi 2C$ of a boost potential control circuit 11 and output signal $\phi 1C$ of the current capability control circuit 12 are supplied to a boost potential generation circuit 13. This circuit arrangement is suitable to, for example, that having a boost potential control circuit 11 in one system and boost potential generation circuit 13 in one system. The boost potential generation circuit 13 has its boost potential $\phi 3$ controlled at a substantially constant level by the output signal $\phi 2C$ of the boost potential control circuit 11 and its current supply capability controlled by the output signal $\phi 1C$ of the current capability control circuit 12. Even this circuit arrangement enables the current supply capability of the boost potential generation circuit 13 to vary while reflecting an output signal $\phi 4$ of a switching circuit 14 as in the circuit arrangements shown in FIGS. 1 and 2.

In the circuit arrangements shown in FIGS. 1 to 3, the current flowing from the boost potential generation circuit 13 into the load circuit 15 varies depending upon the state of the switching circuit 14, whereby the current supply capability of the boost potential generation circuit 13 is so varied as to be set optimal depending upon the state of the switching circuit 14 and it is possible to suppress a ripple in an internal potential resulting from an excess of the current supply capability of the boost potential generation circuit 13.

Applying the internal voltage generation circuit shown in FIGS. 1 to 3 to a DRAM will be explained below in more detail. FIGS. 4 and 5, each, show the case where the load circuit 15 constitutes a DRAM's word line drive system circuit and a boost potential $\phi 3$ is fed as a current supply to the word line drive circuit.

As shown in FIG. 4, memory cell arrays are illustrated as four memory cell arrays MCA0 to MCA3. An X address buffer circuit 16 receives an address input signal Ain and delivers a plurality of X address signals XAj and a plurality of internal address signals AiR and AjR. An X address signal XAj is supplied to word line select drive circuits 19-0 to 19-3 for selecting those word lines of memory cell arrays MCA0 to MCA3 and the internal address signals AiR and AjR are input to a memory cell array select circuit 17 for selecting any of the memory cell arrays MCA0 to MCA3. The memory array select circuit 17 delivers a memory cell array select signal RSLn to designate any memory cell array to be activated. Row decoder select switch circuits 18-0 to 18-3 receive the select signal RSLn from the memory cell array select circuit 17 to select the row decoder of the memory cell array to be activated. The outputs of the row decoders are supplied to the word line select drive circuits 19-0 to 19-3. The word line select drive circuits 19-0 to 19-3 select a word line determined by the X address signal XAj in the memory cell array selected in a way to reflect the memory cell array select signal RSLn. That is, the word line select drive circuits 19-0 to 19-3 decodes the X address signal XAj and set the selected word line to a level corresponding to an output potential of the word line drive potential generation circuit 20. The word line drive potential generation circuit 20 feeds a power supply to the word line select drive circuits 19-0 to 19-3 and constitutes a boost potential generation circuit for steadily generating a high potential. A refresh cycle select circuit 21 generates a refresh cycle select switching signal φ4 in accordance with the potential of a corresponding bonding pad or the state of a corresponding fuse. The switching signal φ4 is supplied to the memory cell array select circuit 17 and word line drive potential circuit 20. The switching signal φ4 supplied to the memory cell array select circuit 17 is used to enable the number of the memory cell arrays, to be activated, to vary in accordance with the refresh cycle set, while the switching signal φ4 supplied to the word line drive potential generation circuit 20 is used to enable the current supply capability of the word line drive potential generation circuit 20 to vary in accordance with the refresh cycle set. If, for example, a 2K refresh cycle product is set in the same Figures, the memory cell arrays MCA0 to MCA3 are all set in an active state and four word lines are selected at a time from the memory cell arrays, that is, one for each memory cell array. In this case, the current drive capability of the word line drive potential generation circuit 20 becomes maximal. For a 4K refresh cycle product, two of four block memory cell arrays MCA0 to MCA3 are placed in an active state and a total of two word lines are selected from the two activated memory cell arrays, one from each of these two memory cell array. At this time, the current drive capability of the word line drive potential generation circuit 20 becomes one-half that of the 2K refresh cycle product. For a 8K refresh cycle product, one word line is selected from one memory cell array activated and the current drive capability of the word line drive potential generation circuit 20 becomes one-fourth that of the 2K refresh cycle product.

The circuit arrangement shown in FIG. 4 is the simplest example and the number of divided blocks, manner of the arrangement, number of word lines, setting of the refresh cycle, etc., are not essential and any other proper circuit arrangements may be adopted.

FIG. 5 shows, in more detail, a block diagram near the refresh cycle select circuit 21, word line drive potential generation circuit 20 and row decoder circuit in the circuit arrangement shown in FIG. 4.

The boost potential control circuit 11, current capability control circuit 12, boost potential generation circuit 13 and load circuit 15 in the circuit arrangement shown in FIG. 1 correspond a word line system boost potential control circuit 22, boost potential generation system control circuit 23, boost potential generation circuit group 24 and word line drive system circuit 25, respectively, in FIG. 5 and the switching circuit 14 corresponds to a refresh cycle select circuit 21. Switching means, such as bonding pads and fuses, is provided in the refresh cycle select circuit 21 and is used as a circuit for selecting a refresh cycle. The word line drive system circuit 25 receives a switching signal φ4 from the refresh cycle select circuit 21 and is used to vary the number of word lines activated at a time.

In the arrangement above, the refresh cycle select circuit 21 delivers a switching signal φ4 to a boost potential generation system control circuit 23. At the setting of a high refresh cycle in which a small drive current only flows through the word line drive system circuit 25, it is possible to decrease the number of systems of those boost potential generation circuits 24-1 to 24-n operated and hence to suppress the current supply capability. It is possible to hold a balance between the current supply capability of the boost potential generation circuit group 24 and a current required of the word line drive system circuit 25 with the boost potential (output) of the circuit group 24 used as a power supply. Since the balance of the two is held even if the set refresh cycle varied, it is possible to supply an optimal current corresponding to a load involved and to suppress a ripple in internal potential.

FIGS. 6 to 11 show details of the forms of the circuits in FIG. 5.

Figure 6:
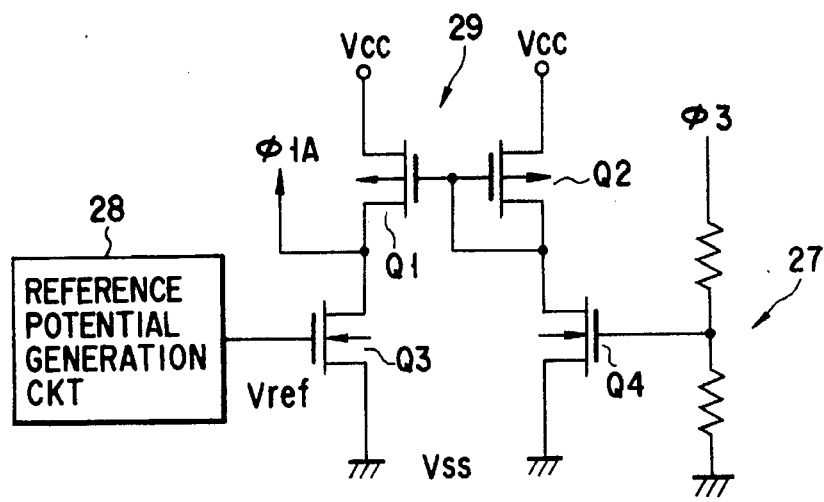
FIG. 6 is a circuit diagram showing a detail of the word line system boost potential control circuit in the circuit arrangement shown in FIG. 5.

FIG. 6 is a practical form of the word line system boost potential control circuit 22 in the circuit arrangement shown in FIG. 5. The control circuit 22 comprises a voltage divider circuit 27 for dividing a boost potential φ3, reference potential generation circuit 28 for generating a reference potential Vref and comparator 29 for comparing an output potential of the voltage divider circuit 27 and the reference potential vref. The circuit 22 delivers a control signal φ1A so as to make the boost potential φ3 substantially constant.

It is desirable that the reference potential generation circuit 28 be comprised of a circuit which is lower in its dependence upon a power supply voltage externally applied. It is, therefore, better to utilize the forward voltage of the diode, a band gap reference circuit comprised of bipolar transistors, etc. These circuits involved are well known in the art and not essential and any further explanation is omitted for the sake of brevity. In the circuit shown in FIG. 6, although the comparator 29 is comprised of P channel type MOS transistors Q1, Q2 and N channel type MOS transistors Q3, Q4, any other proper arrangements can be employed if they perform the same function.

Figure 7A:
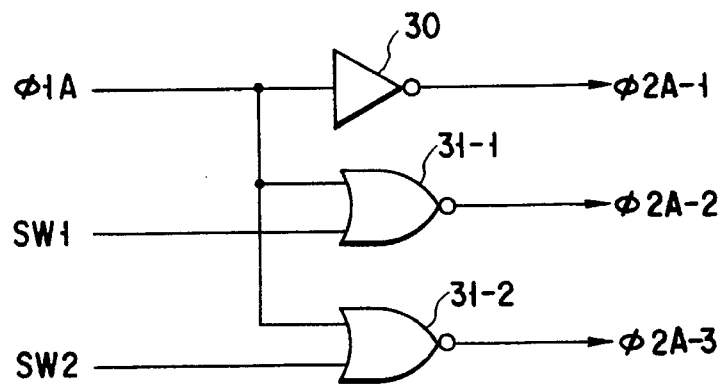
FIG. 7A is a circuit showing a detailed practical form of a boost potential generation system control circuit shown in FIG. 5.

FIG. 7A is a practical form of the boost potential generation system control circuit 23 shown in FIG. 5, that is, it is comprised of three systems. The control circuit 23 is comprised of an inverter 30 and NOR gates 31-1 and 31-2. A signal φ1A shows an output signal of the word line system boost voltage control circuit 22 and is supplied to an input terminal of an inverter 30 and one input terminal of NOR gates 31-1, 31-2. Switching signals SW1 and SW2 are those varied depending upon the state of the refresh cycle set. The signal SW1 is supplied to the other input terminal of the NOR gate 31-1 and the signal SW2 is supplied to the other input terminal of the NOR gate 31-2.

In the above circuit, if the signal SW1 goes high ("H" level), an output signal φ2A-2 of the NOR gate 31-1 becomes a "L" level irrespective of the signal φ1A and, if the signal. SW1 goes low ("L" level), the signal φ2A-2 becomes a signal whose phase is inverted relative to that of the signal φ1A. The same thing is applied to the signal SW2. For the refresh cycle in which more word lines are activated at a time, any signals φ2A-1, φ2A-2 and φ2A-3 reflect φ1A by making the signals SW1, SW2 at a "L" level. Those circuits in the boost potential generation circuit group 24, being supplied with the signals φ2A-1, φ2A-2 and φ2A-3, are placed all in the active state. For a refresh cycle in which less word lines are activated at a time, the signals SW1, SW2 both go high ("H" level) and the signals φ2A-2, φ2A-3 are not made dependent upon the signal φ1A in which case those boost potential generation circuits, being supplied with these signals, are placed in a stopped state. For the case where either the signal SW1 or signal SW2 goes high ("H" level), two of the three system boost potential generation circuits are made an operative state. For example, if the signals SW1 and SW2 are set to an "L" level for the 2K refresh cycle product, either SW1 or SW2 to a "H" level and the other to the "L" level for the 4K refresh cycle product and both SW1 and SW2 to a "H" level for the 8K refresh cycle product, then an optimal current supply capability can be achieved for current from the boost potential generation circuit group 24 to the word line system drive circuit 25 in accordance with the refresh cycle.

Although, in the circuit shown in FIG. 7A, an explanation is given of the case where the operative states of the three system boost potential generation circuits are selected by the two switching signals SW1, SW2, the same way of thought can be extended even to the case where the boost potential generation circuit is of the two or four or more systems. The essence of the above circuit is in whether or not the signal φ1A is transmitted to the respective boost potential generation circuit by the switching signal. This thought can be applied to inverters and NANDs as shown in FIG. 7B and also to the case where the signal relation is inverted.

Figure 7B:
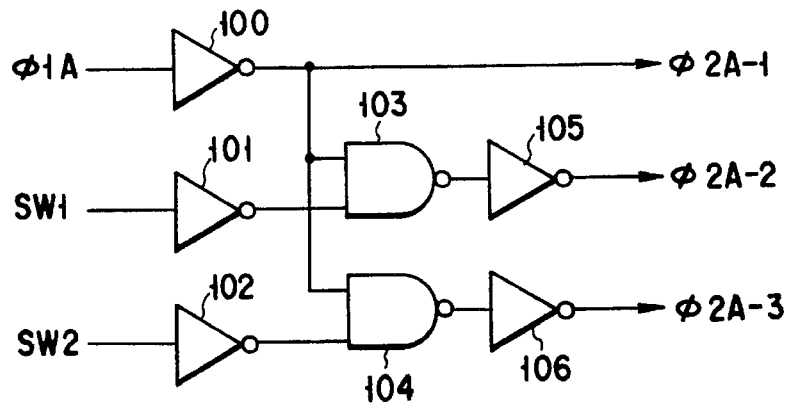
FIG. 7B is a circuit showing a detailed practical form of the other boost potential generation system control circuit shown in FIG. 5.

In the circuit shown in FIG. 7B, a signal φ1A is supplied to the input terminal of an inverter 100, a switching signal SW1 to the input terminal of an inverter 101 and a switching signal SW2 to the input terminal of an inverter 102. An output signal of the inverter 100 is supplied to one input terminal of a NAND gate 103 and an output signal of the inverter 101 is supplied to the other input terminal of the NAND gate 103. The output signal of the inverter 100 is supplied to one input terminal of the NAND gate 104 and an output signal of an inverter 102 is supplied to the other input terminal of the NAND gate 104. The outputs of the NAND gates 103 and 104 are supplied to the input terminals of inverters 105 and 106, respectively. Signals φ2A-1, φ2A-2 and φ2A-3 are output from the inverter 100, inverter 105 and inverter 106, respectively. The circuit shown in FIG. 7B, though being different in its circuit and logic configuration, is substantially the same as in FIG. 7A.

Figure 8A:
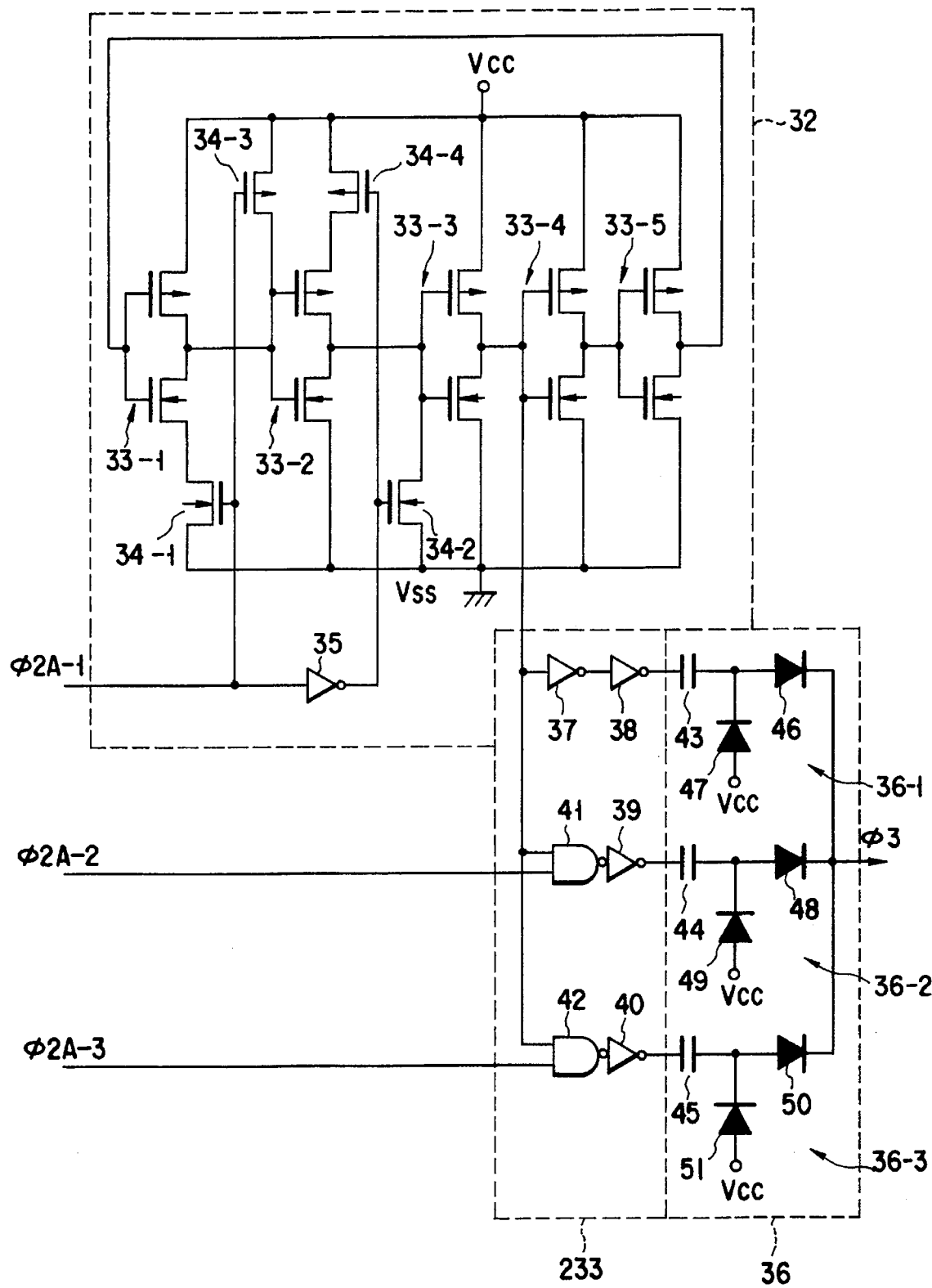
FIG. 8A is a circuit diagram showing a detailed practical form of a boost potential generation circuit group in the circuit arrangement shown in FIG. 5.

FIG. 8A is a practical form of the boost potential generation circuit group 24 comprised of one system oscillator circuit and three system charge pump circuits. The oscillator circuit 32 is known as a ring oscillator in which an odd number of (here five) stages of CMOS inverters 33-1 to 33-5 are connected in a ring configuration. The oscillator has its oscillation controlled by N channel type MOS transistors 34-1 and 34-2 and P channel type MOS transistors 34-3 and 34-4. Between the N channel type MOS transistor in the inverter 33-1 and ground $V_{SS}$, a current path is inserted into MOS transistor 34-1 adapted to be ON/OFF controlled by a signal φ2A-1. A current path in the MOS transistor 34-2 is inserted between the input terminal of the MOS inverter 33-3 and ground $V_{SS}$. An inverter 35 is connected to the gate of the MOS transistor 34-2 to invert the signal φ2A-1. A current path in the MOS transistor 34-3 is inserted between the input terminal of the CMOS inverter 33-2 and a power supply $V_{CC}$ and the signal φ2A-1 is supplied to the gate of the MOS transistor 34-3. Between the P channel type MOS transistor in the inverter 33-2 and the power supply $V_{CC}$ a current path in the MOS transistor 34-4 is so inserted as to be ON/OFF controlled by an inverted signal of the signal φ2A-1 coming from the inverter 35. By the MOS transistors 34-1 to 34-4, the oscillator 32 oscillates when the output signal φ2A-1 of the boost potential generation system control circuit 23 becomes a "L" level and stops when that output signal becomes a "H" level.

A buffer circuit 233 receives an oscillation output of the oscillation circuit 32 and outputs φ2A-2, φ2A-3 of the boost potential generation system control circuit 23 and controls a charge pump circuit 36. The buffer circuit 233 comprises inverters 37 to 40 and NAND gates 41, 42 and the charge pump circuit 36 comprises capacitors 43 to 45 and diodes 46 to 51. The oscillation output of the oscillator circuit 32 is supplied to one input terminal of the inverter 37 and one-input terminal sides of NAND gates 41, 42. A signal φ2A-2 is supplied to the other input terminal of the NAND gate 41 and a signal φ2A-3 is supplied to the other input terminal of the NAND gate 42. The input terminal of the inverter 38 is connected to the output terminal of the inverter 37 and the output terminal of the inverter 38 is connected to one electrode of the capacitor 43. The input terminal of the inverter 39 is connected to the output terminal of the NAND gate 41 and the output terminal of the inverter 39 is connected to one electrode of the capacitor 44. The input terminal of the inverter 40 is connected to the output terminal of the NAND gate 42 and the output terminal of the inverter 40 is connected to one electrode of the capacitor 45. The other electrode of the capacitor 43 is connected to the anode of the diode 46 and cathode of the diode 47. The other electrode of the capacitor 44 is connected to the anode of the diode 48 and cathode of the diode 49. The other electrode of the capacitor 45 is connected to the anode of the diode 50 and cathode of the diode 51. The anodes of the diodes 47, 49 and 51 are connected to a power supply $V_{CC}$ and the cathodes of the diodes 46, 48 and 50 are connected in common with each other. A boost potential φ3 is output from a common point on the cathode side of the diodes 46, 48 and 50.

In the circuit arrangement above, the oscillator 32 oscillates when the signal φ2A-1 becomes a "H" level. With the signals φ2A-2 and φ2A-3 at the "L" level, the capacitor 43 is charged via the inverters 37, 38 and a part 36-1 of the charge pump circuit 36 operates to provide a boost potential φ3. With the signals φ2A-1 and φ2A-2 at the "H" level and the signal φ2A-3 at the "L" level, parts 36-1 and 36-2 of the charge pump circuit 36 operate to provide a boost potential φ3. With the signals φ2A-1, φ2A-2 and φ2A-3 at the "H" level, the charge pump circuit 36 (36-1, 36-2 and 36-3) operates to provide a boost potential φ3. The current drive capability is increased with an increase in the number of operation parts of the charge pump circuit 36.

The circuit arrangement shown in FIG. 8A represents the simplest form of the oscillation circuit 32, buffer circuit 233 and charge pump circuit 36. These circuits, even if being different in their number of systems, may be similarly constructed, though not shown in detail. Various proposals have been made on the detail and oscillation system of the charge pump circuit 36, the practical circuit arrangement is not restricted to one shown in FIG. 8A if the latter performs a similar function.

Figures 8B, 8C:
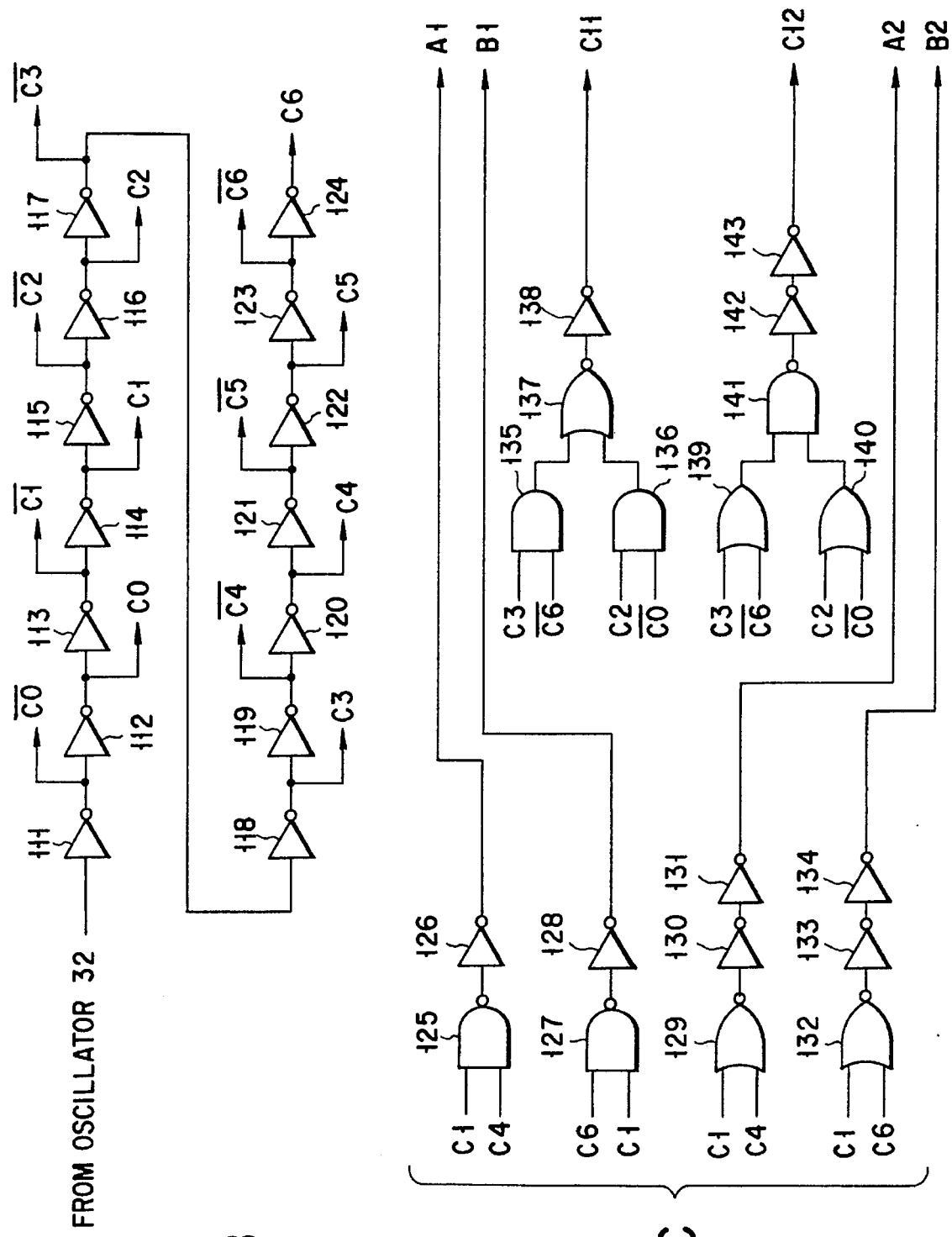
FIGS. 8B and 8C, each, are a circuit diagram showing a practical form of a driver circuit in the circuit arrangement shown in FIG. 8A.

FIGS. 8B and 8C show another practical form of the buffer circuit 233 in FIG. 8A. The circuit shown in FIG. 8B is comprised of cascade-connected inverters 111 to 124. These inverters 111 to 124 produce signals C0 to C6 and signals $\overline{C0}$ to $\overline{C6}$ upon receipt of an oscillation output from the oscillator 32 in the circuit arrangement shown in FIG. 8A. That is, the oscillation output of the oscillator 32 is fed to the inverter 111. The output of the inverter 111 is supplied to the inverter 112 and it delivers a signal $\overline{C0}$ as an output signal. The output of the inverter 112 is supplied to the inverter 113 and it delivers a signal C0 as an output signal. The output of the inverter 113 is supplied to the inverter 114 and it delivers a signal $\overline{C1}$ as an output signal. In this way, the outputs of the inverters 114 to 123 are similarly supplied to sequential-stage inverters 115 to 124 and these inverters produce signals C1 to C5 and $\overline{C2}$ to $\overline{C6}$ in a similar, sequential way. A signal C6 is output from a final-stage inverter 124.

FIG. 8C shows a circuit for receiving the signals C0 to C6 and $\overline{C0}$ to $\overline{C6}$ from the circuit shown in FIG. 8B and producing signals A1, B1, C11, C12, A2 and B2. One input terminal of a NAND gate 125 is supplied with the signal C1 coming from the circuit shown in FIG. 8B and the other input terminal of the NAND gate 125 is supplied with the signal C4. The output signal of the NAND gate 125 are sequentially fed through inverter 126, and the inverter 126 produces a signal A1. The input terminals of a NAND gate 127 is supplied with the signals C6 and C1 and the output signal of the NAND gate 127 is fed to inverter 128. The inverter 128 delivers the signal B1 as an output signal. The input terminals of the NOR gate 129 are supplied with the signals C1 and C4. The output of the NOR gate 129 is sequentially fed through inverters 130 and 131 and the inverter 131 delivers the signal A2 as an output signal. The input terminals of a NOR gate 132 are supplied with the signals C1 and C6. The output of the NOR gate 132 is sequentially fed through inverters 133 and 134 and the inverter 134 produces the signal B2 as an output signal.

Further the input terminals of an AND gate 135 are supplied with the signals C3 and $\overline{C6}$ and the input terminals of an AND gate 136 are supplied with signals C2 and $\overline{C0}$. The output signals of the AND gates 135 and 136 are supplied to a NOR gate 137. The output signal of the NOR gate 137 is fed through inverter 138 to produce a signal C11. The input terminals of an OR gate 139 are supplied with the signals C3 and $\overline{C6}$ and the input terminals of an OR gate 140 are supplied with signals C2 and $\overline{C0}$. The output signals of the OR gates 139 and 140 are supplied to a NAND gate 141. The output signal of the NAND gate 141 is sequentially fed through inverters 142 and 143 and it generates the signal C12.

Figure 8D:
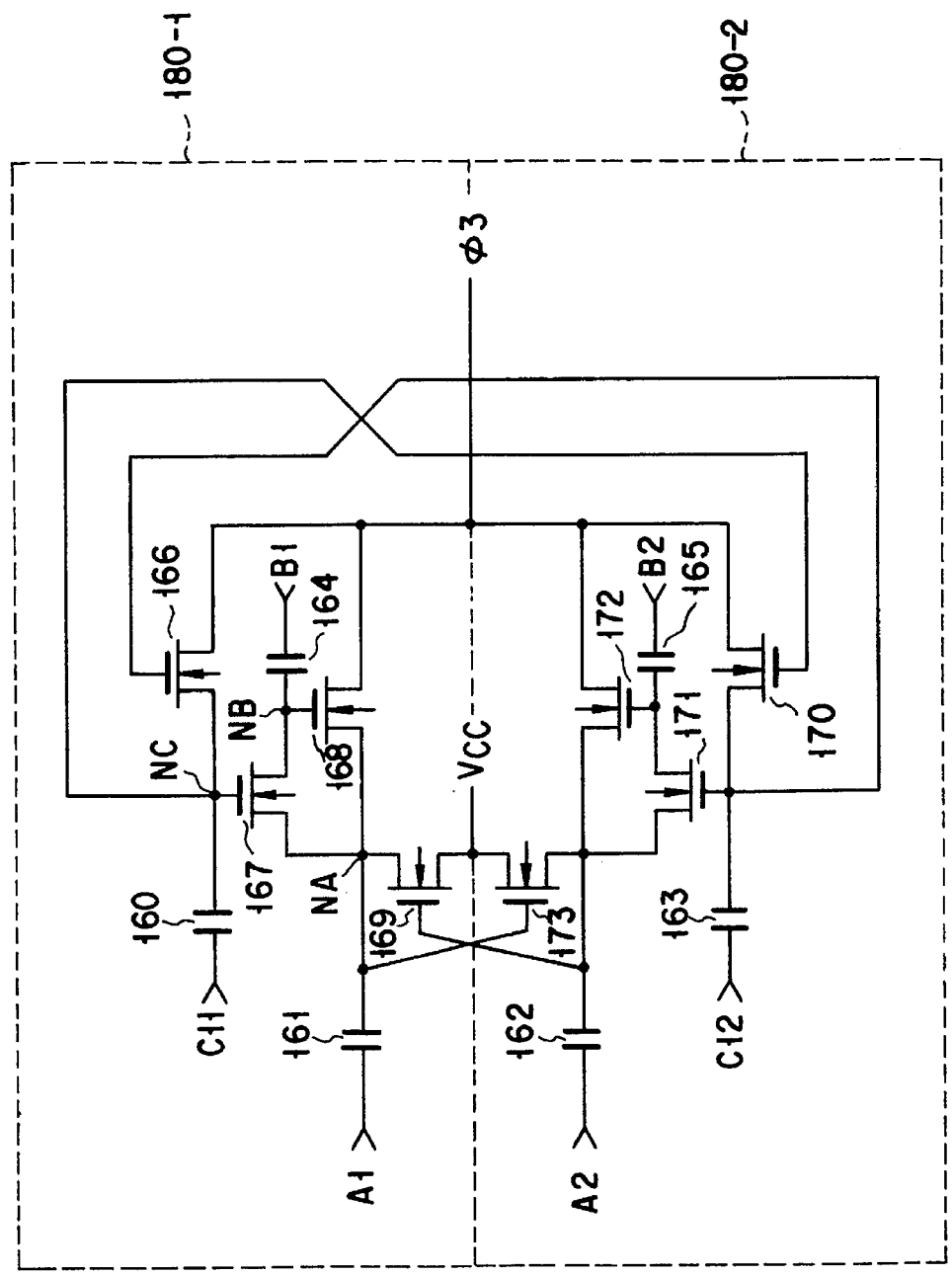
FIG. 8D is a circuit diagram showing another practical form of the charge pump circuit in the circuit arrangement in FIG. 8A.

FIG. 8D shows another practical form of the charge pump circuit 36 in the circuit arrangement in FIG. 8A. The circuit shown in FIG. 8D comprises capacitors 160 to 165 and N channel type MOS transistors 166 to 173. One electrode of the capacitor 160 is connected to the output terminal of the inverter 138 in the circuit shown in FIG. 8C and supplied with the signal C11. One electrode of the capacitor 161 is connected to the output terminal of the inverter 126 and supplied with the signal A1. One electrode of the capacitor 162 is connected to the output terminal of the inverter 131 and supplied with the signal A2. One electrode of the capacitor 163 is connected to the output of the inverter 143 and supplied with the signal C12. One electrode of the capacitor 164 is connected to the output of the inverter 128 and supplied with the signal B1. One electrode of the capacitor 165 is connected to the output of the inverter 134 and supplied with the signal B2.

The other electrode (node NC) of the capacitor 160 is connected to one end of a current path of the MOS transistor 166 and gate of the MOS transistor 167. The other end of the current path of the MOS transistor 166 is connected to an output terminal of a boosted potential $\phi 3$. The gate of the MOS transistor 166 is connected to the other electrode of the capacitor 163, gate of the MOS transistor 171 and one end of a current path of the MOS transistor 170. One end of a current path of the MOS transistor 167 is connected to the other electrode (node NA) of the capacitor 161, one end of a current path of the MOS transistor 169, gate of the MOS transistor 173 and one end of a current path of the MOS transistor 168. The other end of the current path of the MOS transistor 167 is connected to the other electrode (node NB) of the capacitor 164 and gate of the MOS transistor 168. The other end of the current path of the MOS transistor 168 is connected to the output terminal of the boosted potential $\phi 3$. The other end of the current path of the MOS transistor 169 is connected to a power supply $V_{CC}$ and one end of a current path of the MOS transistor 173 and the gate of the MOS transistor 169 is connected to the other electrode of the capacitor 162, other end of the current path of the MOS transistor 173, one end of a current path of the MOS transistor 171, and one end of a current path of the MOS transistor 172. The other end of the current path of the MOS transistor 172 is connected to the output terminal of the boosted potential $\phi 3$ and the gate of the MOS transistor 172 is connected to the other end of the current path of the MOS transistor 171 and other electrode of the capacitor 165. The other end of the current path of the MOS transistor 170 is connected to the output terminal of the boosted potential $\phi 3$ and the gate of the MOS transistor 170 is connected to the other electrode of the capacitor 160.

Figure 8E:
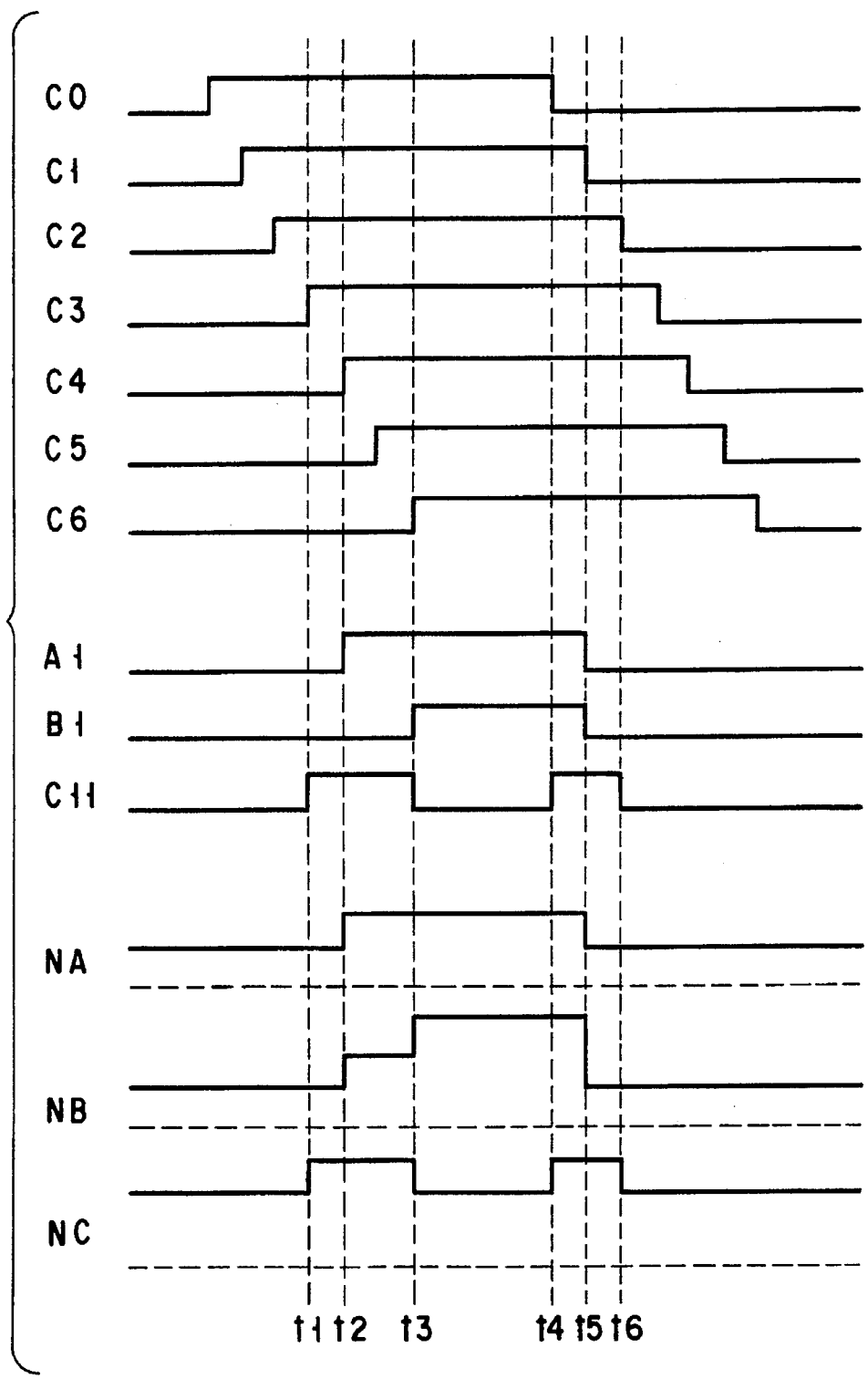
FIG. 8E is a timing chart for explaining the operation of the circuits in FIGS. 8B to 8D.

FIG. 8E is a timing chart for explaining the operation of the circuit of FIGS. 8B to 8D. For brevity of explanation, FIG. 8E shows the operation of a circuit section 180-1 comprising the capacitors 160, 161 and 164 and MOS transistors 166 to 169 in the charge pump circuit shown in FIG. BE. A circuit section 180-2 comprising capacitors 162, 163 and 165 and MOS transistors 170 to 173 operate basically in the same way as the circuit section 180-1.

The operation of the circuits shown in FIGS. 8B to 8D will be explained below, disregarding a parasitic capacitance and assuming that the capacitor coupling ratio is infinite. From the timing chart as shown in FIGS. 8B to 8D it is seen that those signals C0 to C6 output from the circuit shown in FIG. 8B become signals sequentially delayed with a given delay time. At one-cycle completed state, the nodes NA and NB in the charge pump circuit are placed at the $V_{CC}$ level and the node NC at a $2V_{CC}$ level. At time t1 when the signal C11 is boosted from a ground $V_{SS}$ to a $V_{CC}$ level, a potential on the node NC is boosted from a $2V_{CC}$ to a $3V_{CC}$ level due to the capacitive coupling of the capacitor 16. At time t2 when the signal A1 is boosted from the $V_{SS}$ to a $V_{CC}$ level, a potential on node NA is boosted from the $V_{CC}$ to a $2V_{CC}$ level due to the capacitive coupling of the capacitor 161. Since a $3V_{CC}$ potential level is applied to the gate of the MOS transistor 167, the MOS transistor 167 is turned ON and a $2V_{CC}$ level potential is transferred to the node NB. At time t3 when the signal B1 is boosted from the $V_{SS}$ to the $V_{CC}$ level, the node NB is boosted from a $2V_{CC}$ to a $3V_{CC}$ level due to the capacitive coupling of the capacitor 164. At this time, the potential on the node NB and that on the node NC (gate potential) are made equal to each other and the MOS transistor 167 is cut off. As a result, the MOS transistor 168 is turned ON with its gate supplied with a $3V_{CC}$ level potential and a $2V_{CC}$ level potential on the node NA is transferred to the boosted potential $\phi 3$ output terminal. At time t4, the signal C11 is again boosted from the $V_{SS}$ to the $V_{CC}$ level and, at time t5, the signals A1 and B1 fall from the $V_{CC}$ to the $V_{SS}$ level. At time t6, the signal C11 falls from the $V_{CC}$ to the $V_{SS}$ level.

It is because the potential on the node NB is positively initialized to a $V_{CC}$ level that, before and after time t5, the signal C11 is set to the $V_{CC}$ level and the potential on the node NC to the $3V_{CC}$ level.

The above-mentioned potential boosting operation is carried out even in the circuit section 180-2 and a boost potential is obtained from the boost potential φ3 output terminal. Even in the arrangement shown in FIGS. 8B to 8D it is possible to perform substantially the same operation as the circuit shown in FIG. 8A and to obtain the same effect.

FIG. 9A shows a practical form of the refresh cycle select circuit 21 in the circuit arrangement shown in FIG. 5. Here, as the simplest form use is made of a circuit for switching the refresh cycle with the use of bonding wires. This circuit comprises inverters 52, 53 and resistors 54, 55. With pads 56a and 56b, as well as pads 57a and 57b, opened, the inputs of inverters 52 and 53 are supplied with a power supply $V_{CC}$, respectively, through the resistors 54 and 55 and switching signals SW1 and SW2 become a "L" level, with the pads 56a and 56b connected to each other by the corresponding wire bonding, a ground potential $V_{SS}$ is applied to the input terminal of the inverter 52 and the switching signal SW1 becomes a "H" level. With the pads 57a and 57b connected to each other by the corresponding wire bonding, the input terminal of the inverter 53 is supplied with a ground potential $V_{SS}$ and the switching signals SW2 becomes a "H" level.

The levels of the switching signals SW1 and SW2 can be freely set depending upon whether or not the pads are connected by the wire bonding. By using the switching signals SW1 and SW2 as signals for defining the refresh cycle, they perform the function of the refresh cycle select circuit 21 in FIG. 5 and of the switching circuit 14 in FIGS. 1 to 3.

Any proper means, such as fuses, may be used, as shown in FIG. 9B, to determine whether or not the pads 56a and 56b, as well as the pads 57a and 57b, are connected to each other. In the circuit shown in FIG. 9B, a fuse F1 is connected between the input terminal of an inverter 52 and a power supply $V_{CC}$ and a resistor R1 is connected between the input terminal of the inverter 52 and ground $V_{SS}$. Further, a fuse F2 is connected between the input terminal of an inverter 53 and a power supply $V_{CC}$ and a resistor R2 is connected between the input terminal of the inverter 53 and ground $V_{SS}$. In the arrangement above, a circuit the same as that shown in FIG. 9A can be realized by selectively blowing the fuses F1 and F2 by a proper means such as a laser.

In the circuit as shown in FIGS. 9A and 9B, a buffer circuit for generating an in-phase signal is used, as required, in place of the inverters 52 and 53. The same effect can be obtained by a plurality of stages of cascaded inverters.

FIGS. 10 and 11, each, show a practical form of a word line drive system circuit 25 in the circuit arrangement shown in FIG. 5, noting that attention is paid to one word line WL. A circuit shown in FIG. 10 comprises a word line driver select circuit 58, row decoder circuit 59 and word line driver 60. The word line driver select circuit 58 and row decoder circuit 59 comprise a NAND gate 64 and NAND gate 65, respectively, and a boost potential φ3 is supplied, as a power supply potential, to the NAND gates 64 and 65. The word line driver 60 is comprised of a P channel type MOS transistor 61 and N channel type MOS transistors 62 and 63. The output of the row decoder circuit 59 is supplied to the gate of the MOS transistor 61, the output of the word line driver select circuit 58 to the source of the MOS transistor 61 and a boost potential φ3 to the back gate of the MOS transistor 61. The drain-to-source path of the MOS transistor 62 is connected between the drain of the MOS transistor 61 and ground $V_{SS}$ and the output of the row decoder 59 is fed to the gate of the MOS transistor 62. The drain-to-source path of the MOS transistor 63 is connected between the drain of the MOS transistors 61, 62 and ground $V_{SS}$ and a control signal S is supplied to the gate of the MOS transistor 63 to set the word line WL at a low level when the MOS transistor 61 is turned OFF.

The features of the word line system drive circuit 25 lie in that the driver for driving the word line WL is comprised of the P channel type MOS transistor 61 whose source is supplied with a signal corresponding to the boost potential φ3 and that the number of the P type channel type MOS transistors 61 driven at a time is varied by the refresh cycle select circuit 21. The system constituting a word line driver as the P channel type MOS transistor can set the word line WL at an adequately high level even when an externally applied power supply voltage is low, a technique to which attention has recently been given. In this case, high stability is naturally required for the boost potential φ3 supplied as the power supply to the word line drive system circuit 25.

FIG. 11 shows another form of the word line drive system circuit 25. In this circuit, a word line drive select circuit 58 comprises a NAND gate 64 and inverter 66 and a row decoder circuit 59 comprises a NAND gate 65, NOR gate 67 and inverter 68. A word line driver 60 comprises a P channel type MOS transistor 61 and N channel type MOS transistor 62 and, in comparison with the circuit arrangement in FIG. 10, can eliminate the need to provide the MOS transistor (FIG. 10) 63. The output of the inverter 66 and that of the NAND 65 are supplied to the NOR gate 67. The output of the NOR gate 67 is supplied through the inverter 68 to the gates of the MOS transistors 61 and 62. The boost potential φ3 is supplied as a power supply to the NANDs 64, 65, inverters 66, 68 and NOR gate 67. The boost potential φ3 is supplied to the source and back gate of the MOS transistor 61.

For the circuit arrangement above, it is also possible to perform the same operation as that of FIG. 10 with substantially the same effect.

According to the semiconductor integrated circuit device above, even if the product specification is varied, the load circuit can be driven with an optimal current drive capability. For a semiconductor memory device having a product specification such as the use of a different refresh cycle and the use of a word line system drive circuit as a load circuit, the word line drive system circuit can be driven with an optimal current drive capability corresponding to the refresh cycle and, even in any refresh cycles set, substantially the same write/read access can be ensured. Further, since any greater load capacity is not required, it is possible to suppress a ripple without either increasing the chip size or lowering reliability. It is also possible to provide a refresh cycle product without varying the switching circuit for one kind of chip manufactured and to prevent a lowering in development and production efficiency. Further the present invention can be applied to the case where different refresh cycles are tested at a time of either product testing or shipment.

The semiconductor memory device, varying the product specification with the use of wire bonding and fuse, ensures an enhanced development efficiency and enhanced production efficiency. Since a normal boost potential can be used as a power supply for the word line drive circuit, it is possible for this system to prevent a lowering of a power supply potential supplied from an external source. According to the present invention, therefore, advantages of both can effectively be elicited, thus ensuring an enhanced development efficiency, enhanced production efficiency, high reliability, reduced chip size, etc.

Although the above is related to applying the arrangement corresponding to the block diagram in FIG. 1 to DRAM, it is also substantially applied to the circuit shown in FIG. 2. The internal voltage control circuit shown in FIG. 2 is suited to the boost potential control circuit and boost potential generation circuit both constructed as including a plurality of systems.

FIG. 12 shows a practical form of the boost potential control circuit 11 and of the boost potential generation circuit 13 in FIG. 2. The output signals φ1B-1, φ1B-2 and φ1B-3 of the current capability control circuit 12 are supplied to boost potential control circuits 11-1 to 11-3, respectively. Of these boost potential control circuits 11-1 to 11-3, the control circuit 11-1 shown as a representative one comprises P channel type MOS transistors Q5, Q6, Q10 and N channel type MOS transistors Q7 to Q9. The MOS transistors Q5 to Q9 constitute a comparator. The comparator compares an output potential Vref of a reference potential generation circuit 28 with the output potential of a voltage divider 27 corresponding to a boost potential φ3 and delivers a result of comparison as an output signal φ2B-1 to the input of an inverter 69-1. The signal φ1B-1 is supplied to the gates of the MOS transistors Q9 and Q10 and, when the signal φ1B-1 goes low ("L" level), the MOS transistor Q10 is turned ON and the MOS transistor Q9 OFF. As a result, the comparator operation stops and the input of the inverter 69-1 is placed at an "H" level. Since, in this case, the output of the inverter 69 is at a "L" level and an oscillator 70-1 stops its operation. When, on the other hand, the signal φ1B-1 goes high ("H" level), the MOS transistor is turned ON and the MOS transistor Q10 OFF. The comparator compares the output potential Vref of the reference potential generation circuit 28 with the potential corresponding to the boost potential φ3 passed through the divider 27. A result of the comparison is supplied as φ2B-1 to the inverter 69-1. When a fall in the level of the boost potential φ3 is detected, the inverter 69-1 is placed at the "L" level and the oscillator 70-1 operates. With a rise of the boost potential φ3, the inverter 69-1 is placed at the "H" level and the oscillator 70-1 stops. Through the sequential repetition of such operations the boost potential φ3 is so controlled as to be made constant.

With the oscillator 70-1 operating, the oscillator output is supplied trough a buffer 71-1 to a charge pump circuit 72-1 and a boost potential φ3 is delivered as an output.

The output boost potential control circuits 11-2 and 11-3 have the same arrangement as set out above and perform similar operations in response to signals φ1B-2 and φ1B-3. Thus the control circuits can select a current drive capability in accordance with the output signals φ1B-1, φ1B-2 and φ1B-3 of the current capability control circuit 12.

Figure 15A:
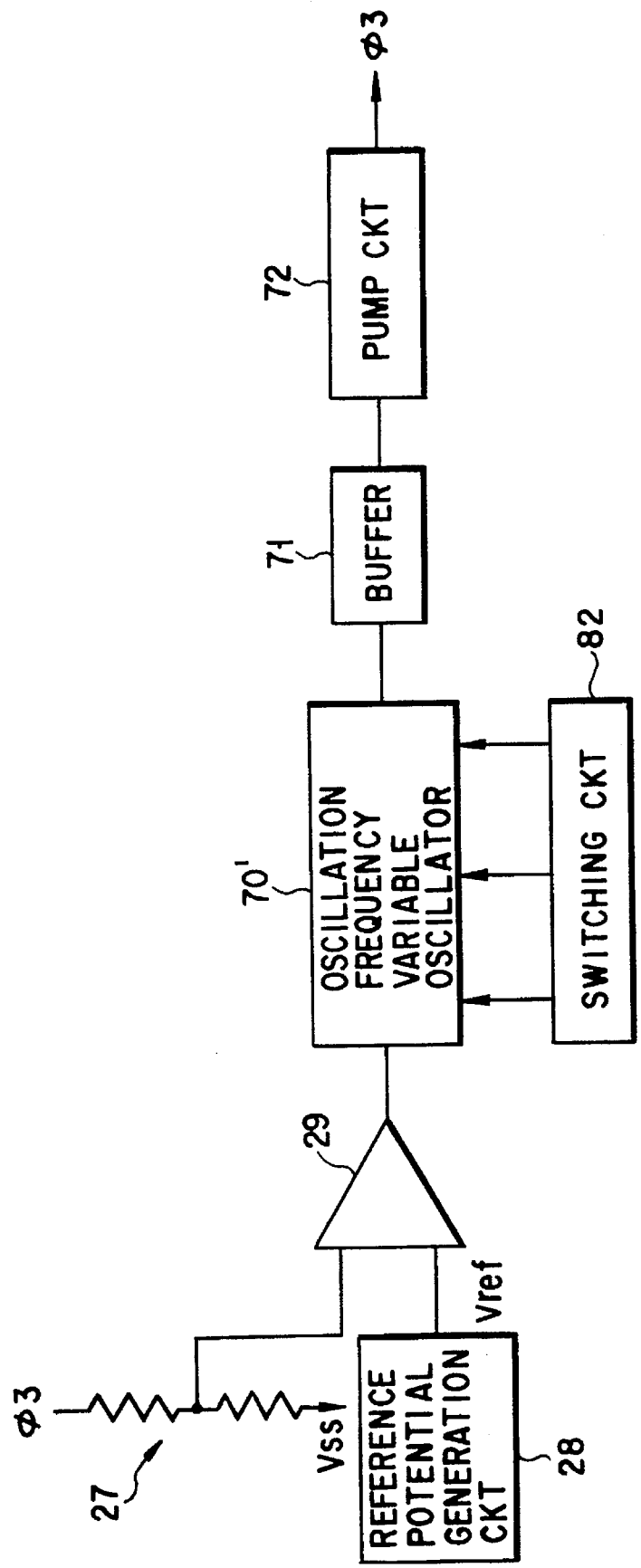
FIG. 15A shows another detailed practical form of the boost potential control circuit and of the boost potential generation circuit, a view showing one oscillator whose oscillation frequency is varied.

FIGS. 13 to 15A show a practical form of the boost potential control circuit 11 and of the boost potential generation circuit 13 in the block circuit in FIG. 3. In the arrangement above, the boost potential generation circuit 13 receives the output signal φ2C of the boost potential control circuit 11 and output signal φ1C of the current capability control circuit 12. The arrangement of FIG. 13 is applied to the case where the semiconductor memory device comprises a one-system boost potential control circuit and one-system boost potential generation circuit. In this arrangement, the current capability control circuit 12 varies the current supply capability of the boost potential generation circuit 13 instead of varying the number of the drive systems of the boost potential generation circuit 13. In the case where the boost potential generation circuit 13 is of a charge pump system boost potential circuit, it is possible to vary the frequency of the oscillator or to vary the current supply capability of a charge pump circuit by inserting a transistor on a path from a power supply terminal to a boost potential φ3 output terminal and vary its ON current. FIG. 13 shows the practical circuit form having a plurality of oscillators of different oscillation frequencies in which the oscillation frequency varies by the selection of these oscillators. FIG. 14 shows a practical circuit form adapted to vary the current supply capability of a charge pump circuit. FIG. 15 shows a practical circuit form adapted to vary the oscillation frequency by one oscillator.

In the circuit shown in FIG. 13, oscillators 73-1 to 73-3 oscillate with different corresponding frequencies and any one of the oscillation outputs of the oscillators 73-1 to 73-3 is selected and then supplied through a buffer 71 to a charge pump circuit 72. The transfer gates 74-1 . . . 74-3 are supplied with the output signals φ1C-1 . . . φ1C-3 of the current capability control circuit and their inverted signals $\overline{\phi 1C-1}$ . . . $\overline{\phi 1C-3}$ respectively. Any selected oscillator output is supplied through the transfer gate and buffer 71 to the charge pump circuit 72. The charge pump circuit 72 delivers, from the circuit 72, a boost potential φ3 of a current supply capability corresponding to the selected oscillator.

In the circuit shown in FIG. 14, the output of a comparator 29 is supplied to an oscillator 70. The oscillation output of the oscillator 70 is supplied through a buffer 75 to one electrode of a capacitor 76. The other electrode of the capacitor 76 is connected to the anode of a diode 77 and cathode of a diode 78. The current paths of N channel type MOS transistors 79 . . . 81 are connected in parallel array between the anode of the diode 78 and a power supply $V_{CC}$. The gates of the MOS transistors 79 . . . 81 are supplied with output signals φ1C-1 . . . φ1C-3, respectively, of the current capability control circuits 12. The cathode of the diode 77 delivers, as an output, a boost potential φ3 of the current supply capability corresponding to a resultant ON resistance of the MOS transistors 79 . . . 81.

In the circuit shown in FIG. 15A, an oscillation frequency variable oscillator 70' and switching circuit 82 for varying the oscillation frequency of the oscillator 70' are provided between a comparator 29 and a buffer 71.

Figure 15B:
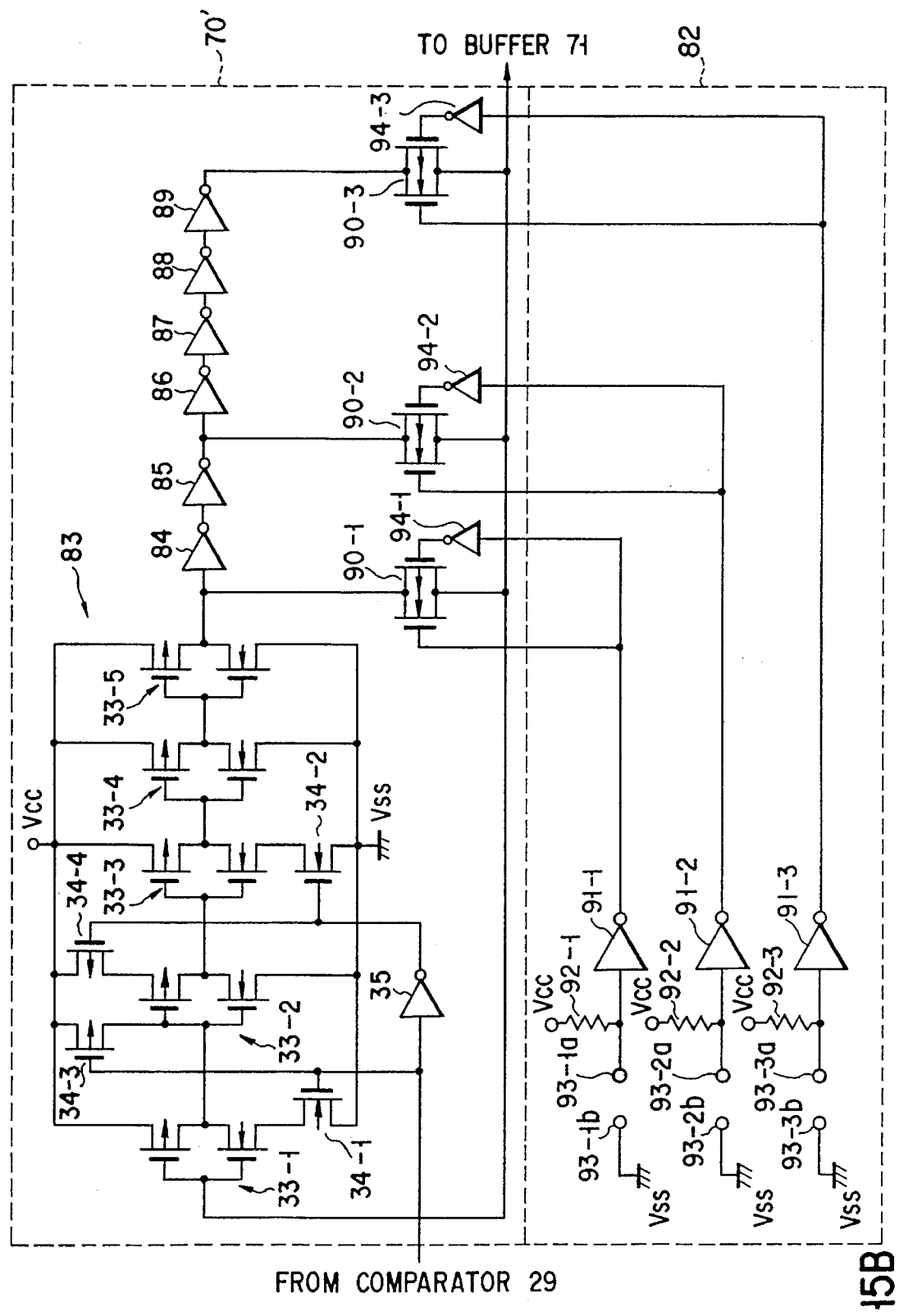
FIG. 15B is circuit diagram showing a practical form of an oscillation frequency variable oscillator and of the switching circuit in the circuit arrangement shown in FIG. 15A.

FIG. 15B shows practical form of the oscillation frequency variable oscillator 70' and switching circuit 82 in the circuit shown in FIG. 15A. The basic arrangement of the oscillation section 83 in the oscillator 70' is substantially the same as the circuit shown in FIG. 8A and, in this arrangement, the same reference numerals are employed to designate parts or elements corresponding to those shown in FIG. 8A and any detailed explanation of them is omitted. In FIG. 15B, inverters 84 . . . 89 are cascade-connected in a feedback loop of the oscillator 83. A transfer gate 90-1 is connected between the output terminal of the oscillator 83 (output terminal of an inverter 33-5). The transfer gate 90-1 is comprised of the current path of an N channel type MOS transistor and of P channel type MOS transistor in a parallel array. A transfer gate 90-2 is connected between the output terminal of the inverter 85 and the input terminal of the oscillator 83 (the input terminal of the inverter 33-1) and a transfer gate 90-3 is connected between the output terminal of the inverter 89 and the input terminal of the oscillator section 83.

The switching circuit 82 switches the oscillation frequency of the oscillator 70' through a wire bonding and comprises inverters 91-1, 91-2 and 91-3 and resistors 92-1, 92-2 and 92-3. Resistors 92-1, 92-2 and 92-3 are connected between the input terminals of the inverters 91-1, 91-2 and 91-3 and a power supply $V_{CC}$, respectively. Pads 93-1a, 93-2a and 93-3a are connected to the inverters 91-1, 91-2 and 91-3, respectively. Pads 93-1b, 93-2b and 93-3b are so provided as to correspond to the pads 93-1a, 93-2a and 93-3a and these pads are connected to ground $V_{SS}$. The output of the inverter 91-1 is connected to the gate of the N channel type transistor in the transfer gate 90-1 and to the gate of the P channel type MOS transistor in the transfer gate 90-1 through an inverter 94-1. The output terminal of the inverter 91-2 is connected to the gate of an N channel type MOS transistor in the transfer gate 90-2 and to the gate of a P channel type MOS transistor in the transfer gate 90-2 via an inverter 94-2. The output terminal of the inverter 91-3 is connected to the gate of an N channel type MOS transistor in the transfer gate 90-3 and to the gate of a P channel type MOS transistor in the transfer gate 90-3 through an inverter 94-3.

In the case where the pads 93-1a and 93-1b are connected by the wire bonding and pads 93-2a and 93-2b and pads 93-3a and 93-3b are in the open state, the output of the inverter 91-1 becomes a "H" level and the outputs of the inverters 91-2 and 91-3 become a "L" level. As a result, the transfer gate 90-1 is turned ON and the transfer gates 90-2 and 90-3 are turned OFF. Thus the output of the inverter 33-5 is connected to the input of the inverter 33-1 to create a ring oscillator. In the case where the pads 93-2a and 93-2b are connected by the wire bonding and the pads 93-1a and 93-1b, as well as the pads 93-3a and 93-3b, are placed in an open state, the output of the inverter 91-2 becomes an "H" level and the outputs of the inverters 91-1 and 91-3 become a "L" level. As a result, the transfer gate 90-2 is turned ON and transfer gates 90-1 and 90-3 are turned OFF. The inverters 84 and 85 are present between the output of the output terminal and the input of the inverter 33-1 to provide a 7-stage inverter ring oscillator. In the case where the pads 93-3a and 93-3b are connected by the wire bonding and the pads 93-1a and 93-1b as well as the pads 93-2a and 93-2b are opened, the output of the inverter 91-3 becomes an "H" level and the outputs of the inverters 91-1 and 91-2 becomes a "L" level. By doing so, the transfer gate 90-3 is turned ON and transfer gates 90-1 and 90-2 are turned OFF. In this case, the inverters 84 to 89 are present between the output of the inverter 33-5 and the input of the inverter 33-1 to provide a 11-stage inverter ring oscillator.

It is, therefore, possible to vary the oscillation frequency of the oscillator 70' depending upon between which pads the wire bonding is connected.

Even in the arrangement shown in FIG. 15A it is possible to obtain the same advantage as in the circuit as shown in FIGS. 13 and 14.

Although the boost potential delivered from the boost potential generation circuit has been explained as being used as a power supply for the DRAM's word line drive system circuit and the current supply capability as being varied in accordance with the refresh cycle, the present invention can be applied also to a semiconductor memory device other than DRAM. If a load is varied according to a variation in the product specification and driven with a corresponding boost potential, it is possible to apply the present invention to the case where modification is made with respect to other than the refresh cycle. It is also possible to apply the present invention to those semiconductor integrated circuit devices.

As set out above, according to the present invention, a semiconductor integrated circuit device can be obtained which has a boost potential generation circuit capable of driving a load circuit with an optimal current drive capability even if the product specification is varied. A semiconductor memory device is also obtained which has a boost potential generation circuit capable of driving a word line drive system circuit with a current drive capability corresponding to the refresh cycle. Further, a semiconductor integrated circuit device can be manufactured which has a boost potential generation circuit capable of suppressing a ripple without increasing the size of a chip and lowering in reliability.

What is claimed is:

1. A semiconductor memory device comprising:

boosted potential generating means for steadily generating a boosted potential which is higher than an external voltage supplied thereto;

word line driving means, receiving the boosted potential of said boosted potential generating means as a power supply, for driving word lines; and control means for receiving a designation signal for designating one of a plurality of refresh cycles and for supplying, to said boosted potential generating means, a control signal, which is generated based on the designation signal, for setting a current supply capability of said boosted potential generating means in accordance with the number of word lines driven by said word line driving means in the designated refresh cycle, wherein the control signal generated by said control means increases the current supply capability of said boosted potential generating means when the number of word lines driven in the refresh cycle designated by the designation signal is increased, and decreases the current supply capability of said boosted potential generating means when the number of word lines driven in the refresh cycle designated by the designation signal is decreased.

2. The semiconductor memory device according to claim 1, further comprising a refresh cycle select circuit for delivering, as an output signal, the designation signal for designating the refresh cycle.

3. The semiconductor memory device according to claim 1, wherein said boosted potential generating means includes a plurality of boosted potential generating circuits whose output terminals are connected in common, said plurality of boosted potential generating circuits being selected by said control means so that the current supply capability is set in accordance with the number of word lines driven at a time.

4. The semiconductor memory device according to claim 1, wherein said boosted potential generating means comprises an oscillator having an oscillation operation controlled by said control means, a plurality of charge pumps for boosting an oscillation output of said oscillator, and a driven circuit for selectively supplying the oscillation output of said oscillator to said charge pump circuits under control of said control means.

5. The semiconductor memory device according to claim 1, wherein said word line driving means includes a P channel type MOS transistor for setting the word line at a high level, wherein the boosted potential is applied to said P channel type MOS transistor.

6. The semiconductor memory device according to claim 1, wherein said word line driving means comprises a word line driver select circuit operated with the boosted potential as a power supply, a row decoder circuit operated with the boosted potential as a power supply, and a word line driver for driving a corresponding word line in response to an output of said word line driver select circuit and an output of said row decoder circuit.

7. The semiconductor memory device according to claim 6, wherein said word line driver comprises a P channel type MOS transistor having a first current terminal supplied with an output signal of said word line driver select circuit, a second current terminal connected to the corresponding word line, a gate supplied with an output signal of said row decoder circuit, and a back gate supplied with the boosted potential, a first N channel type MOS transistor having a first current terminal connected to the corresponding word line, a second current terminal connected to ground, and a gate supplied with the output signal of said row decoder circuit, and a second N channel type MOS transistor having a first current terminal connected to the corresponding word line, a second current terminal connected to ground, and a gate receiving a control signal for setting the corresponding word line at a low level when said P channel type MOS transistor is turned OFF.

8. The semiconductor memory device according to claim 6, wherein said word line driver comprises a P channel type MOS transistor having a first current terminal supplied with the boosted potential, a second current terminal connected to the corresponding word line, and a gate supplied with an output signal of said row decoder circuit, and an N channel type MOS transistor having a first current terminal connected to the corresponding word line, a second current terminal connected to ground, and a gate supplied with the output signal of said row decoder circuit, a back gate of said P channel type MOS transistor being supplied with the boosted potential.

9. The semiconductor memory device according to claim 1, wherein said control means includes comparing means for comparing a reference potential and the boosted potential delivered from said boosted potential generating means and for setting the boosted potential constant on the basis of a result of the comparison.

10. A semiconductor memory device, comprising:

memory cells connected to word lines;

word line driving potential generating circuitry for generating a word line driving potential and outputting the word line driving potential at an output terminal thereof;

word line driving circuitry, supplied with the word line driving potential, for driving said word lines;

control circuitry, responsive to a refresh cycle signal for designating one of a plurality of refresh cycles, for generating a control signal to set a current supply capability of said word line driving potential generating circuitry in accordance with the number of word lines driven simultaneously by said word line driving circuitry in the refresh mode designated by the refresh cycle signal.

11. The semiconductor memory device according to claim 10, wherein the current supply capability of said word line driving potential generating circuitry is decreased if the refresh cycle signal is changed to designate a second refresh cycle in which the number of word lines driven simultaneously is less than the number of word lines which are driven simultaneously in a first refresh cycle previously designated by the refresh cycle signal.

12. The semiconductor memory device according to claim 10, further comprising:

refresh cycle signal generating circuitry for generating the refresh cycle signal.

13. The semiconductor memory device according to claim 12, wherein said refresh cycle signal generating circuitry comprises at least one refresh cycle signal generating circuit including:

a first pad connected to a first power supply potential;

a second pad;

a resistor having a first terminal connected to a second power supply potential and a second terminal connected to said second pad; and an inverter having an input terminal connected to said second pad, wherein an output of said inverter is set in accordance with the connection/disconnection of said first pad to said second pad.

14. The semiconductor memory device according to claim 12, wherein said refresh cycle signal generating circuitry comprises at least one refresh cycle signal generating circuit including:

an inverter having an input terminal;

a fuse having a first terminal connected to a first power supply potential and a second terminal connected to the input terminal of said inverter;

a resistor having a first terminal connected to a second power supply potential and a second terminal connected to the input terminal of said inverter, wherein an output of said inverter is set in accordance with the blown/unblown state of said fuse.

15. The semiconductor memory device according to claim 10, wherein said word line driving potential generating circuitry comprises a plurality of word line driving potential generating circuits and the control signal generated by said control circuitry sets the current supply capability of said word line driving potential generating circuitry by controlling said plurality of word line driving potential generating circuits.

16. The semiconductor memory device according to claim 10, wherein said word line driving potential generating circuitry comprises:

an oscillator; and a plurality of charge pump circuits for boosting an output of said oscillator, wherein the control signal generated by said control circuitry sets the current drive capability of said word line potential generating circuit by selecting the number of said charge pump circuits which are operated.

17. The semiconductor memory device according to claim 16, wherein each charge pump circuit comprises:

a capacitor having a first terminal connected to said oscillator, and a second terminal;

a first diode having an anode connected to a first power supply potential and a cathode connected to the second terminal of said capacitor; and a second diode having an anode connected to the second terminal of said capacitor and a cathode connected to the output terminal of said word line driving potential generating circuitry.

18. The semiconductor memory device according to claim 17, wherein the output of said oscillator is constantly supplied to the first terminal of the capacitor of one of said charge pump circuits and is selectively supplied to the first terminal of the capacitor of the other charge pump circuits in accordance with the control signal generated by said control circuitry.

19. The semiconductor memory device according to claim 16, further comprising:

buffer circuitry for logically combining the control signal from said control circuitry and the output of said oscillator to thereby set the number of charge pump circuits which are operated.

20. The semiconductor memory device according to claim 10, wherein stud word line driving potential generating circuitry comprises a plurality of word line driving potential generating circuits, each word line driving potential generating circuit including an oscillator and a charge pump circuit.

21. The semiconductor memory device according to claim 20, wherein said control circuitry includes a plurality of control circuits, each control circuit outputting a part of the control signal to a respective corresponding one of said word line driving potential generating circuits, wherein the control signal generated by said control circuitry sets the current drive capability of said word line driving potential generating circuitry by selecting said oscillators for operation.

22. The semiconductor memory device according to claim 10, wherein said word line potential generating circuitry comprises:

a charge pump circuit;

a plurality of oscillators; and a plurality of transfer gates, each transfer gate connected between said charge pump circuit and a respective corresponding one of said oscillators, wherein the control signal generated by said control circuitry sets the current drive capability of said word line driving potential generating circuitry by selecting said oscillators for operation and by controlling said transfer gates to couple outputs of the oscillators selected for operation to said charge pump circuit.

23. The semiconductor memory device according to claim 10, wherein said word line driving potential generating circuitry comprises:

an oscillator; and a charge pump circuit including a variable resistor, wherein the control signal generated by said control circuitry sets the current drive capability of said word line driving potential generating circuitry by setting the resistance of said variable resistor of said charge pump circuit.

24. The semiconductor memory device according to claim 10, wherein said word line driving potential generating circuitry comprises:

a charge pump circuit;

an oscillator having a variable oscillating frequency;

and a switching circuit for setting the frequency of said oscillator, wherein the control signal generated by said control circuitry sets the current drive capability of said word line driving potential generating circuitry by controlling said switching circuit to set the frequency of said oscillator.

25. The semiconductor memory device according to claim 10, wherein said word line driving circuitry comprises:

word line driving select circuits operated with the word line driving potential as a power supply potential;

row decoder circuits operated with the word line driving potential as a power supply potential; and word line driving circuits for driving said word lines in accordance with outputs of said word line driving select circuits and said row decoder circuits.

26. The semiconductor memory device according to claim 25, wherein each of said word line driving circuits comprises:

a first MOS transistor of a first conductivity type having a first current terminal supplied with an output of a corresponding one of said word line driving select circuits, a second terminal connected to a corresponding word line, a gate supplied with an output of a corresponding one of said row decoder circuits, and a back gate supplied with the word line driving potential;

a second MOS transistor of a second conductivity type having a first current terminal connected to the corresponding word line, a second current terminal connected to a ground potential, and a gate supplied with the output of the corresponding row decoder circuit; and a third MOS transistor of the second conductivity type having a first current terminal connected to the corresponding word line, a second current terminal connected to the ground potential, and a gate supplied with a signal for setting the corresponding word line at a low level when said first MOS transistor is turned OFF.

27. The semiconductor memory device according to claim 25, wherein each of said word line driving circuits comprises:

a first MOS transistor of a first conductivity type having a first current terminal supplied with the word line driving potential, a second current terminal connected to a corresponding one of said word lines, a gate supplied with an output of a corresponding one of said row decoder circuits, and a back gate supplied with the word line driving potential; and a second MOS transistor of a second conductivity type having a first current terminal connected to the corresponding word line, a second current terminal connected to a ground potential, and a gate supplied with the output of the corresponding row decoder circuit.

28. A semiconductor memory device, comprising:

memory cell arrays, each memory cell array including memory cells connected to word lines;

word line driving potential generating circuitry for generating a word line driving potential and outputting the word line driving potential at an output terminal thereof;

an address buffer circuit for receiving address signals and outputting internal address signals and word line selecting signals;

word line driving circuits, each word line driving circuit supplied with the word line driving potential and driving the word lines in a corresponding one of said memory cell arrays in accordance with the word line selecting signals;

a selecting circuit, responsive to the internal address signals and a refresh cycle signal for designating one of a plurality of refresh cycles, for generating a memory cell array select signal for selecting said memory cell arrays;

control circuitry, responsive to the refresh cycle signal, for generating a control signal to set a current supply capability of said word line driving potential generating circuitry in accordance with the number of word lines driven simultaneously by said word line driving circuitry in accordance with the word line selecting signals and the memory cell array select signal in the refresh cycle designated by the refresh cycle signal.

29. The semiconductor memory device according to claim 28, wherein said word line driving potential generating circuitry comprises a plurality of word line driving potential generating circuits and the control signal generated by said control circuit sets the current supply capability of said word line driving potential generating circuitry by controlling said plurality of word line driving potential generating circuits.

30. The semiconductor memory device according to claim 28, wherein said word line driving potential generating circuitry comprises:

an oscillator; and a plurality of charge pump circuits for boosting an output of said oscillator, wherein the control signal generated by said control circuit sets the current drive capability of said word line potential generating circuit by selecting the number of charge pump circuits which are operated.

31. The semiconductor memory device according to claim 30, wherein each charge pump circuit comprises:

a capacitor having a first terminal connected to said oscillator, and a second terminal;

a first diode having an anode connected to a first power supply potential and a cathode connected to the second terminal of said capacitor; and a second diode having an anode connected to the second terminal of said capacitor and a cathode connected to the output terminal of said word line driving potential generating circuitry.

32. The semiconductor memory device according to claim 31, wherein the output of said oscillator is constantly supplied to the first terminal of the capacitor of one of said charge pump circuits and is selectively supplied to the first terminal of the capacitor of the other charge pump circuits in accordance with the control signal generated by said control circuitry.

33. The semiconductor memory device according to claim 30, further comprising:

buffer circuitry for logically combining the control signal from said control circuitry and the output of said oscillator to thereby set the number of charge pump circuits which are operated.

* * * * *